(12) United States Patent
Choi et al.

(10) Patent No.: US 9,082,680 B2
(45) Date of Patent: Jul. 14, 2015

(54) JOINT STRUCTURES HAVING ORGANIC PRESERVATIVE FILMS

(75) Inventors: Ju-Il Choi, Suwon-si (KR); Jeong-Gi Jin, Osan-si (KR); Ui-Hyoung Lee, Hwaseong-si (KR); Hyung-Seok Kim, Seoul (KR); Jeong-Woo Park, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 94 days.

(21) Appl. No.: 13/535,766

(22) Filed: Jun. 28, 2012

(65) Prior Publication Data
US 2013/0000978 A1 Jan. 3, 2013

(30) Foreign Application Priority Data
Jun. 29, 2011 (KR) .................. 10-2011-0063795

(51) Int. Cl.
*H05K 1/16* (2006.01)
*H05K 1/18* (2006.01)
(Continued)

(52) U.S. Cl.
CPC .............. *H01L 24/16* (2013.01); *B23K 1/0016* (2013.01); *H01L 24/11* (2013.01); *H01L 24/13* (2013.01); *H01L 25/0657* (2013.01); *H01L 25/105* (2013.01); *H05K 1/181* (2013.01); *H05K 3/3442* (2013.01); *B23K 2201/42* (2013.01); *H01L 23/3128* (2013.01); *H01L 24/81* (2013.01); *H01L 2224/1146* (2013.01); *H01L 2224/1147* (2013.01); *H01L 2224/1357* (2013.01); *H01L 2224/13082* (2013.01); *H01L 2224/13083* (2013.01); *H01L 2224/13111* (2013.01); *H01L 2224/13139* (2013.01); *H01L 2224/13147* (2013.01); *H01L 2224/13155* (2013.01); *H01L 2224/13562* (2013.01); *H01L 2224/13565* (2013.01); *H01L 2224/13566* (2013.01); *H01L 2224/13647* (2013.01); *H01L 2224/13686* (2013.01); *H01L 2224/16145* (2013.01); *H01L 2224/16146* (2013.01); *H01L 2224/16225* (2013.01); *H01L 2224/16227* (2013.01); *H01L 2224/16235* (2013.01); *H01L 2224/32225* (2013.01); *H01L 2224/48227* (2013.01);
(Continued)

(58) Field of Classification Search
CPC ....... H01L 24/16; H01L 24/13; H01L 25/105; H01L 24/11; H01L 25/0657; H05K 3/3442; H05K 3/3436; H05K 2201/10674; H05K 2201/10734; H05K 3/282; H05K 13/0465; H05K 2203/041; H05K 3/4007; H05K 1/181; H05K 2201/10234; H05K 2203/121; B23K 1/0016
See application file for complete search history.

(56) References Cited

U.S. PATENT DOCUMENTS

| | | | |
|---|---|---|---|
| 4,643,793 A * | 2/1987 | Nakaso et al. | 156/306.6 |
| 5,808,360 A | 9/1998 | Akram | |
| 5,960,251 A * | 9/1999 | Brusic et al. | 428/551 |
| 8,242,011 B2 * | 8/2012 | Lim et al. | 438/613 |
| 2001/0019882 A1 * | 9/2001 | Jiang | 438/584 |
| 2003/0127747 A1 | 7/2003 | Kajiwara et al. | |

(Continued)

FOREIGN PATENT DOCUMENTS

| | | |
|---|---|---|
| JP | 2010-093259 | 4/2010 |
| KR | 10-0605314 | 1/2006 |

(Continued)

*Primary Examiner* — Ishwarbhai B Patel
(74) *Attorney, Agent, or Firm* — Myers Bigel Sibley & Sajovec, P.A.

(57) ABSTRACT

The inventive concept provides methods for inhibiting the formation of one or more oxides on metal bumps during the formation of solder joint structures and solder joint structures including one or more preservative films. In some embodiments, the solder joint structure includes a metal bump having a preservative film disposed on the surface thereof.

16 Claims, 33 Drawing Sheets

(51) Int. Cl.
*H01L 23/00* (2006.01)
*H05K 3/34* (2006.01)
*B23K 1/00* (2006.01)
*H01L 25/065* (2006.01)
*H01L 25/10* (2006.01)
*H05K 3/40* (2006.01)
*H01L 23/31* (2006.01)

(52) U.S. Cl.
CPC .............. *H01L2224/73204* (2013.01); *H01L 2224/73253* (2013.01); *H01L 2224/73265* (2013.01); *H01L 2224/81193* (2013.01); *H01L 2225/06513* (2013.01); *H01L 2225/06517* (2013.01); *H01L 2225/06541* (2013.01); *H01L 2225/1023* (2013.01); *H01L 2225/1058* (2013.01); *H01L 2924/01029* (2013.01); *H01L 2924/15311* (2013.01); *H01L 2924/18161* (2013.01); *H05K 3/3489* (2013.01); *H05K 3/4007* (2013.01)

(56) References Cited

U.S. PATENT DOCUMENTS

| | | |
|---|---|---|
| 2006/0017161 A1 | 1/2006 | Chung et al. |
| 2010/0090318 A1 | 4/2010 | Hsu et al. |
| 2010/0090319 A1 | 4/2010 | Hsu et al. |
| 2010/0213591 A1 | 8/2010 | Ho et al. |
| 2011/0049703 A1* | 3/2011 | Hsu et al. ............... 257/737 |
| 2011/0086505 A1* | 4/2011 | Yu ............................ 438/614 |
| 2011/0101521 A1* | 5/2011 | Hwang et al. ............ 257/737 |
| 2011/0233761 A1* | 9/2011 | Hwang et al. ............ 257/737 |
| 2011/0304042 A1* | 12/2011 | Lin et al. ................. 257/737 |
| 2012/0270432 A1* | 10/2012 | Jaeckle et al. ........... 439/397 |

FOREIGN PATENT DOCUMENTS

| | | |
|---|---|---|
| KR | 10-2007-0053555 | 5/2007 |
| KR | 10-2009-0082030 | 7/2009 |
| KR | 10-2010-0040259 | 4/2010 |
| KR | 10-2010-0095268 | 8/2010 |

\* cited by examiner

JOINT STRUCTURES HAVING ORGANIC PRESERVATIVE FILMS

CROSS-REFERENCE TO RELATED APPLICATION

This application claims priority under 35 U.S.C. §119 to Korean Patent Application No. 10-2011-0063795 filed on Jun. 29, 2011, the disclosure of which is hereby incorporated by reference in its entirety.

FIELD OF THE INVENTION

The inventive concept relates to methods of inhibiting the formation of oxides during the formation of solder joint structures.

BACKGROUND

The reliability of a solder joint structure including a soldering unit and a metal bump may be degraded by the formation of an oxide layer on the surface of the metal bump. Although noble metals may be used to prevent the formation of such oxide layers, their use often entails additional materials, processes and fabrication costs. There is thus a need for improved methods of inhibiting the formation of oxide layers on metal bumps.

The inventive concept provides preservative films, useful for inhibiting the formation of oxide layers on metal bumps, methods of forming solder joint structures and devices formed using such methods.

SUMMARY

Exemplary embodiments of the inventive concept provide preservative films. In example embodiments, the preservative film includes one or more organic materials (e.g., the preservative film may include one or more nitrogen-containing compounds). In example embodiments, the preservative film includes one or more organic metal compounds (e.g., a metal-nitrogen compound, a metal-imino compound, a metal-amino compound, a metal-benzotriazole compound and/or a metal-imidazole compound).

Exemplary embodiments of the inventive concept provide solder joint structures including a metal bump and a soldering unit. In example embodiments, the metal bump may include copper. In example embodiments, the metal bump may include a preservative film of the inventive concept. In example embodiments, the solder joint structure includes a soldering unit coupled between two metal bumps, wherein at least one of the metal bumps includes a preservative film of the inventive concept. Solder joint structures of the inventive concept may be formed according to one or more methods of the inventive concept.

Exemplary embodiments of the inventive concept provide a device stack structure, package stack structure or package mounting structure including one or more solder joint structures of the inventive concept. In example embodiments, the device stack structure, package stack structure or package mounting structure includes a preservative film of the inventive concept.

Exemplary embodiments of the inventive concept provide a semiconductor device including one or more solder joint structures of the inventive concept. In example embodiments, the semiconductor device includes one or more solder joint structures including a preservative film of the inventive concept. In example embodiments, the semiconductor device includes an optical transceiver.

Exemplary embodiments of the inventive concept provide an electronic system including one or more solder joint structures of the inventive concept. In example embodiments, the electronic system includes one or more solder joint structures including a preservative film of the inventive concept.

Exemplary embodiments of the inventive concept provide methods of inhibiting the formation of one or more oxides on the surface of a metal bump (e.g., methods of inhibiting the formation of copper oxide on the surface of a copper bump). In example embodiments, the method includes forming a preservative film on the surface of the metal bump. In some such embodiments, the method further includes removing at least one oxide (e.g., a native oxide layer) from the surface of the metal bump prior to and/or concurrently with formation of the preservative film thereon.

Exemplary embodiments of the inventive concept provide methods of forming a solder joint structure. In example embodiments, the method includes forming a preservative film on a surface of a metal bump and coupling the surface of the metal bump to a soldering unit. In some such embodiments, coupling the surface of the metal bump to the soldering unit includes contacting preservative film on the surface of the metal bump with the soldering unit and heating the soldering unit.

Exemplary embodiments of the inventive concept provide a solder joint structure including a lower metal bump, a soldering unit, and a organic preservative film. In example embodiments, the soldering unit is coupled to at least a portion of a top surface of the lower metal bump. In example embodiments, the organic preservative film is disposed on at least one lateral surface of the lower metal bump.

Exemplary embodiments of the inventive concept provide a solder joint structure including a lower bump on a lower substrate, an upper bump beneath an upper substrate, a soldering unit connecting a top surface of the lower bump to a bottom surface of the upper bump, and a metal compound covering a lateral surface of the lower bump.

Exemplary embodiments of the inventive concept provide a solder joint structure including a lower copper bump on a lower conductive elements, an upper copper bump on a upper conductive elements, a soldering unit between the lower copper bump and the upper copper bump, the soldering unit directly in contact with a portion of a top surface of the lower copper bump, and an organic copper compound covering a portion of a lateral surface of the lower copper bump.

As one of skill in the art will appreciate, preservative films and methods of the inventive concept may be used to inhibit the formation of oxides on the surface of a metal bump, thereby enabling the metal bump to physically and electrically interact with a soldering unit in a stable manner. Accordingly, preservative films and structures of the inventive concept can be used to provide highly reliable electronic devices.

BRIEF DESCRIPTION OF THE DRAWINGS

The foregoing and other aspects, features and advantages of the inventive concept will be apparent from the following detailed description of exemplary embodiments of the inventive concept, as illustrated in the accompanying drawings, in which like reference characters refer to the same parts throughout the different views. The drawings are not necessarily to scale, emphasis instead being placed upon illustrating the principles of the inventive concepts. In the drawings.

DETAILED DESCRIPTION

Figure 1A:
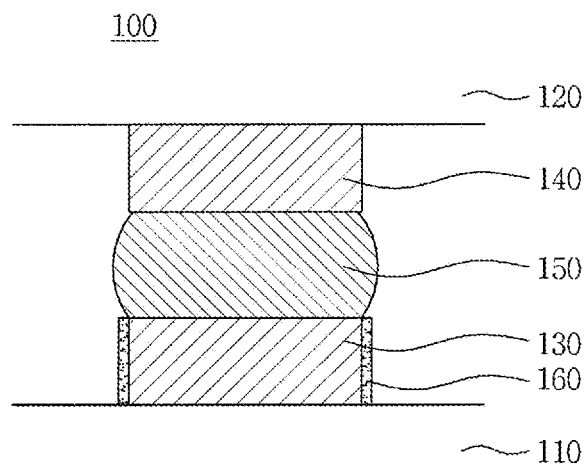
FIGS. 1A-1O are conceptual longitudinal sectional views of solder joint structures according to various embodiments of the inventive concept.

Various example embodiments will be described more fully hereinafter with reference to the accompanying drawings, in which some example embodiments are shown. The present inventive concept may, however, be embodied in many alternate forms and should not be construed as limited to the example embodiments set forth herein. Rather, these embodiments are provided so that this description will be thorough and complete, and will fully convey the scope of the inventive concept to one skilled in the art.

In the drawings, the shapes and relative sizes of respective elements, components, layers, regions and sections may be exaggerated for clarity. Like numerals refer to like elements throughout. Names and functions of components not shown or not labeled with reference numerals will easily be understood from other drawings and descriptions contained herein.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms "first," "second," "third," etc. may be used herein to describe various elements, components, regions, layers and/or sections, such elements, components, regions, layers and/or sections are not limited by those terms. Unless the context clearly indicates otherwise indicated, the terms are used only to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing.

The terminology used herein is for the purpose of describing particular embodiments only and is not intended to be limiting of example embodiments.

Unless otherwise defined, all terms used herein (including technical or scientific terms) have the same meanings as those which are generally understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the singular forms "a," "an" and "the" are intended to include the plural forms as well, unless the context clearly indicates otherwise.

As used herein, the terms "include," "including," "include," "including" and grammatical variants thereof specify the presence of stated features, integers, steps, operations, elements, components, regions, layers and/or sections, but do not preclude the presence or addition of one or more other features, integers, steps, operations, elements, components, regions, layers, sections and/or groups thereof.

As used herein, the terms "bump" and "metal bump" refer to a protrusion including one or more metals. Bumps of the inventive concept may include any suitable metal(s), including, but not limited to, nickel and copper. In some instances, bumps are described by one or more of their constituent metals. For example, a bump including copper may be referred to as a "copper bump" and a bump including nickel may be referred to as a "nickel bump." Similarly, a bump including nickel and copper may be referred to as a "copper-nickel bump."

Hereinafter, example embodiments of the inventive concept will be explained in detail with reference to the accompanying drawings.

Preservative films of the inventive concept may include any material suitable for inhibiting the formation of one or more oxides on the surface of a metal bump. For example, the preservative film may include one or more materials suitable for inhibiting the formation of copper oxide on a copper bump.

Preservative films of the inventive concept may further include any material suitable for removing one or more oxides from the surface of a metal bump. For example, the preservative film may include one or more materials suitable for removing copper oxide form the surface of a copper bump.

Preservative films of the inventive concept may include one or more organic materials. In some embodiments, the preservative film includes one or more nitrogen-containing compounds, imino-containing compounds and amino-containing compounds. In some embodiments, the preservative film includes one or more azoles. For example, the preservative film may include one or more benzotriazoles and/or imidazoles.

Preservative films of the inventive concept may include one or more organic metal compounds (e.g., one or more organic metal compounds that is stable in air and which forms a protective barrier on the surface(s) of the metal bump, thereby inhibiting oxidation of the underlying metal layer). In some embodiments, the preservative film includes one or more metal-nitrogen compounds, one or more metal-imino compounds, one or more metal-amino compounds, one or more metal-benzotriazole compounds and/or one or more metal-imidazole compounds. For example, the preservative film may include a copper-nitrogen compound, a copper-imino compound, a copper-amino compound, a copper-benzotriazole compound and/or a copper-imidazole compound.

Preservative films of the inventive concept may include one or more layers. In some embodiments, the preservative film includes one or more layers having a thickness of between about 0.1 μm and about 1.0 μm. In some embodiments, the preservative film includes a monolayer having a thickness of between about 1 Å and about 7 Å.

Preservative films of the inventive concept may be formed using any suitable method, including, but not limited to, immersing at least one surface of a metal bump in a solution including one or more constituents of the preservative film and/or spraying at least one surface of a metal bump with a solution including one or more constituents of the preservative film. The metal bump may be passively or actively dried following application of a solution including one or more constituents of the preservative film. For example, one or more surfaces of a copper bump may be immersed in or sprayed with a solution including benzotriazole and/or imidazole and then drying the copper bump, thereby forming a preservative film including a copper-benzotriazole compound and/or a copper-imidazole compound on the surface(s) of the bump. In some embodiments, the preservative film is formed by immersing a copper bump in and/or spraying a copper bump with a solution (e.g., a water-based solution) including benzotriazole represented by Chemical Formula 1:

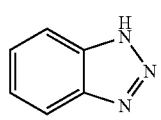

Chemical Formula 1 such that at least a portion of the benzotriazole in the solution reacts with at least a portion of the copper in the copper bump to form a copper-benzotriazole compound expressed by Chemical Formula 2:

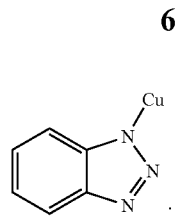

Chemical Formula 2

In some embodiments, the preservative film is formed by immersing a copper bump in and/or spraying a copper bump with a solution (e.g., a water-based solution) including imidazole represented by Chemical Formula 3:

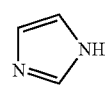

Chemical Formula 3 such that at least a portion of the benzotriazole in the solution reacts with at least a portion of the copper in the copper bump to form a copper-imidazole compound expressed by Chemical Formula 4:

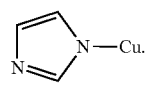

Chemical Formula 4

In some embodiments, the preservative film is formed by immersing a copper bump in and/or spraying a copper bump with a solution (e.g., a water-based solution) including benzotriazole and imidazole (as represented by Chemical Formulas 1 and 2, for example) to form a preservative film including both a copper-benzotriazole compound (as represented by Chemical Formula 2, for example) and a copper-imidazole compound (as represented by Chemical Formula 4, for example).

Preservative films according to various embodiments of the inventive concept may be formed using water solutions containing a nitrogen group (—N), an imino group (NH), or an amino group (—NH2). The nitrogen group, the imino group, or the amino group may combine with a Cu element to produce Cu—N, Cu—NH, or Cu—NH2, and deposited on the surface of Cu, thereby preventing formation of a CuO layer on the surface of Cu. Accordingly, the preservative films according to various embodiments of the inventive concept may contain various organic metal compounds.

Solder joint structures may include one or more metal bumps and a soldering unit.

Solder joint structures of the inventive concept may include any suitable metal bump, including, but not limited to, bumps including nickel and/or copper (e.g., a nickel-copper bump). In some embodiments, one or more of the metal bumps include a portion of an interconnection, an input/output (I/O) pad, or a land. In some embodiments, one or more of the metal bumps include a first portion including a first metal and a second portion including a second metal, wherein the first and second metals are different and wherein the first portion may be substantially free of the second metal and/or the second portion may be substantially free of the first metal. For example, a solder joint structure of the inventive concept may include one or more nickel-copper bumps, wherein each nickel-copper bump includes a first portion including nickel and a second portion including copper, wherein the first portion is substantially free of copper and the second portion is substantially free of nickel.

Metal bumps included of first and second portions as described above may possess one or more advantageous properties. In some embodiments, the presence of different conductive materials in the first and second portions reduces the negative effects of thermal stress on the metal bump (i.e., by reducing the effect(s) of thermal stress attributable to the presence of any given conductive material). For example, in a metal bump including a first portion that includes a first metal and is substantially free of a second metal and a second portion that includes the second metal and is substantially free of the first metal, tensile stress caused by the presence of the first metal may be counterbalanced by compressive stress caused by the presence of the second metal, and vice versa. Thus, in a metal bump including first and second portions as described above, the effect(s) of thermal stress may be counterbalanced by the selective inclusion of metals in the first and second portions. Moreover, the resistance of the metal bump may be selectively controlled by modifying the relative thicknesses of the first and second portions and the metal(s) contained within each portion. For example, the resistance of a nickel-copper bump may be selectively controlled by increasing/decreasing the copper content of the metal bump relative to its nickel content (e.g., by increasing the thickness of a copper-containing second portion relative to a nickel-containing first portion). Indeed, because copper has a lower resistance than nickel, a solder joint structure having relatively low resistance may be formed using a metal bump including a nickel-containing first layer and a copper-containing second layer, wherein the thickness of the copper-containing second layer is equal to or greater than the thickness of the nickel-containing first layer.

Solder joint structures of the inventive concept may include any suitable soldering unit, including, but not limited to, soldering units including tin and/or silver. In some embodiments, the soldering unit includes a solder ball. In some embodiments, the lateral surfaces of the soldering unit protrude beyond the lateral surfaces of the metal bump(s) to which it is coupled.

Solder joint structures of the inventive concept may further include any suitable substrate, including, but not limited to substrates including a wafer, a semiconductor chip, a package substrate, a printed circuit board (PCB), a module board and/or a motherboard. In some embodiments, the solder joint structure includes a lower substrate including one or more lower metal bumps and/or an upper substrate including one or more upper metal bumps.

Solder joint structures of the inventive concept may further include any suitable conductor, including, but not limited to, conductors including a metal interconnection, a via plug, a redistribution structure, a TSV and/or a metal pad. One or more conductors may be interposed between each of the metal bumps and the substrate upon which it is formed. In some embodiments, two or more conductors are interposed between a metal bump and the corresponding substrate. For example, the substrate may include a wafer and the solder joint structure may include a first conductor including a metal interconnection and a second conductor including a via plug, a pad or a redistribution structure. Similarly, the substrate may include a PCB and the solder joint structure may include a first conductor including a metal interconnection or a metal plane of the PCB and a second conductor including a via plug or a land of the PCB.

Solder joint structures of the inventive concept may further include any suitable insulating material, including, but not limited to, include silicon oxide, silicon nitride, silicon oxynitride, polyimide (PI), photosensitive PI (PSPI), benzocyclobutene (BCB), epoxy, plastic, ceramic, and various resins.

Solder joint structures of the inventive concept may further include any suitable preservative film, including, but not limited to, a preservative film of the inventive concept. In some embodiments, a preservative film is formed on one or more surfaces of one or more of the metal bumps in the solder joint structure (e.g., a preservative film may be formed on one or more surfaces of each of the metal bumps in the solder joint structure). A preservative film may be formed on any suitable surface of a metal bump and may cover all or a, portion of each of the surfaces on which it is formed. In some embodiments, a preservative film is formed on at least a portion of the surface of a metal bump that is coupled to the soldering unit (e.g., a portion of the contacting surface that is not in contact with the soldering unit). In some embodiments, a preservative film is formed on at least a portion of a surface of the metal bump that is not coupled to the soldering unit (e.g., a portion of one or more lateral surfaces of a metal bump that is contacted by the soldering unit only on its top surface). In embodiments including a metal bump with first and second portions as described above, a preservative film may be formed on one portion of the metal bump and not the other (e.g., on the copper-containing second portion of a nickel-copper bump, but not on the nickel-containing first portion thereof).

Solder joint structures of the inventive concept may be formed using any suitable method, including, but not limited to, methods of the inventive concept.

As shown in FIGS. 1A-1O, in some embodiments, a solder joint structure 100 of the inventive concept may include a lower metal bump 130 formed on a lower substrate 110, an upper metal bump 140 formed on an upper substrate 120 and a soldering unit 150 interposed therebetween. The solder joint structure 100 may further include one or more preservative films 160.

Each of the lower substrate 110 and upper substrate 120 may include any suitable substrate, including, but not limited to, a wafer, a semiconductor chip, a package substrate, a module board and a motherboard.

Each of the lower metal bump 130 and the upper metal bump 140 may include a first portion including a first metal and a second portion including a second metal, wherein the first and second metals are different. For example, as shown in FIGS. 1D-1I and 1L-1O, the lower metal bump 130 may include a metal bump including a first portion 131 including a first metal (e.g., nickel) and a second portion 133 including a second metal (e.g., copper), wherein the first portion 131 may be substantially free of the second metal and/or the second portion 133 may be substantially free of the first metal. In some such embodiments, the first portion 131 includes nickel and is substantially free of copper and the second portion 133 includes copper and is substantially free of nickel.

Figure 1B:
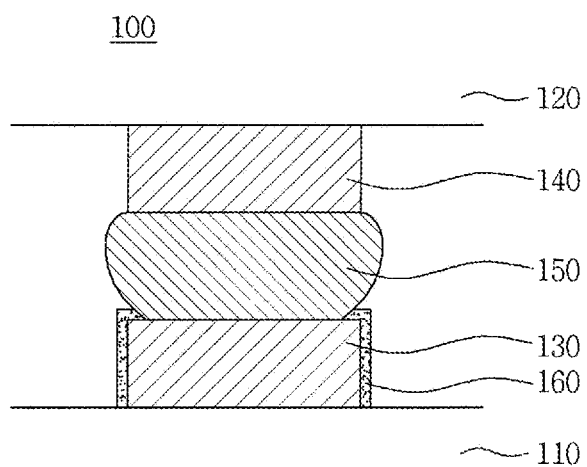

The soldering unit 150 may contact any suitable surface of the lower metal bump 130 and the upper metal bump 140. For example, the soldering unit 150 may contact a portion of the top surface of the lower metal bump 130 as shown in FIGS. 1B, 1E and 1H; the entire top surface of the lower metal bump 130 as shown in FIGS. 1A, 1C, 1D, 1F, 1G and 1I-1O; one or more of the lateral surfaces of the lower metal bump 130 as shown in FIGS. 1C, 1F, 1I, 1K, 1M and 1O; a portion of the bottom surface of the upper metal bump 140 as shown in FIGS. 1A, 1D and 1G; the entire bottom surface of the upper metal bump 140 as shown in FIGS. 1B, 1C, 1E, 1F and 1H-1O and/or one or more of the lateral surfaces of the upper metal bump 140 as shown in FIGS. 1E, 1H, 1K, 1M and 1O.

A preservative film 160 (e.g., a preservative film of the inventive concept) may be formed on the lower metal bump 130. A preservative film 160 may be formed on any suitable surface(s) of the lower metal bump 130. In some embodiments, a preservative film 160 is formed on two or more surfaces of the lower metal bump 130. In some embodiments, a preservative film 160 is formed on at least a portion of the surface of the lower metal bump 130 that is to be coupled to the soldering unit 150. For example, as shown in FIGS. 1B, 1E and 1H, a preservative film 160 may be formed on a portion of the top surface of the lower metal bump 130, wherein the top surface of the lower metal bump 130 is coupled to the soldering unit 150. Likewise, as shown in FIGS. 1C, 1F, 1I, 1K, 1M and 1O, a preservative film 160 may be formed on a portion of the lateral surfaces of the lower metal bump 130, wherein the lateral surfaces of the lower metal bump 130 are coupled to the soldering unit 150. In some embodiments, a preservative film 160 is formed on at least a portion of the surface(s) that are not coupled to the soldering unit 150. For example, as shown in FIGS. 1A, 1B, 1D, 1E, 1G, 1H, 61, 1L and 1O, a preservative film 160 may be formed on the lateral surface(s) of the lower metal bump 130, wherein the lateral surfaces of the lower metal bump 130 are not coupled to the soldering unit 150.

In some embodiments, a preservative film 160 is selectively formed on one or more portions of the lower metal bump 130. For example, as shown in FIGS. 1G-1I, 1L and 1M, a preservative film may be selectively formed on the second portion 133 of the lower metal bump 130 and not on the first portion 131 of the lower metal bump.

FIG. 1A depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130 and a portion of the bottom surface of the upper metal bump 140. A preservative film 160 (e.g., a preservative film of the inventive concept) is disposed on the lateral surfaces of the lower metal bump 130.

FIG. 1B depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts a portion of the top surface of the lower metal bump 130 and the bottom surface of the upper metal bump 140. A preservative film 160 (e.g., a preservative film of the inventive concept) is disposed on the lateral surfaces of the lower metal bump 130.

Figure 1C:
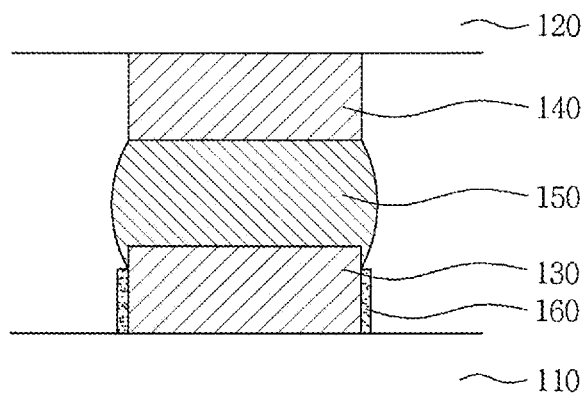
Figure 1D:
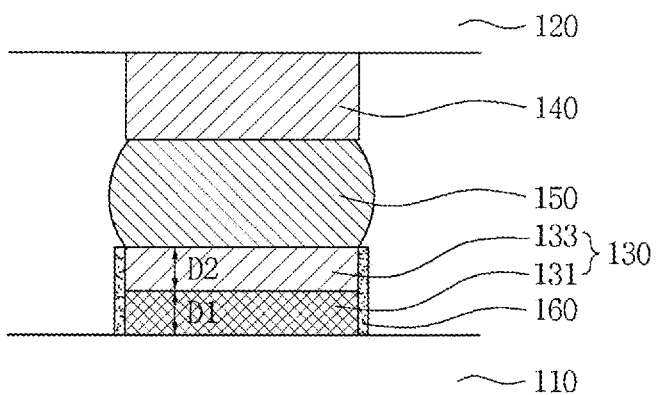
Figure 1E:
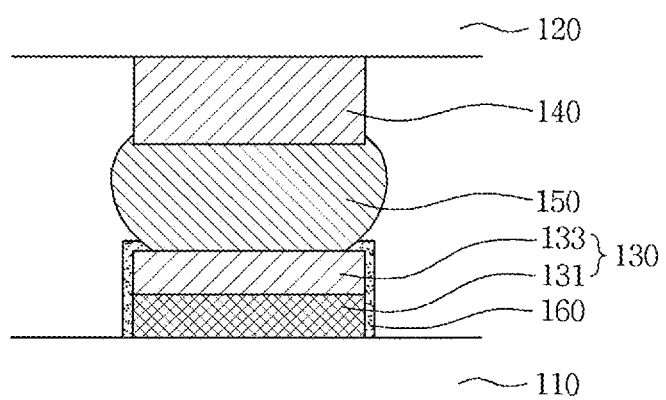

FIG. 1C depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130, portions of the lateral surfaces of the lower metal bump 130 and the bottom surface of the upper metal bump 140. A preservative film 160 (e.g., a preservative film of the inventive concept) is disposed on portions of the lateral surfaces of the lower metal bump 130.

FIG. 1D depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130 and a portion of the bottom surface of the upper metal bump 140. The lower metal bump 130 includes a first portion 131 and a second portion 133, wherein the first portion 131 has a thickness D1, includes a first metal (e.g., nickel) and may be substantially free of a second metal (e.g., copper) and wherein the second portion 133 has a thickness D2, includes the second metal and may be substantially free of the first metal. A preservative film 160 (e.g., a preservative film of the inventive concept) is disposed on the lateral surfaces of the first portion 131 and the second portion 133 of the lower metal bump 130.

FIG. 1E depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts a portion of the top surface of the lower metal bump 130, the bottom surface of the upper metal bump 140 and portions of the lateral surfaces of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is disposed on the lateral surfaces of the first portion 131 of the lower metal bump 130, on the lateral surfaces of the second portion 133 of the lower metal bump 130 and on a portion of the top surface of the lower metal bump 130.

Figure 1F:
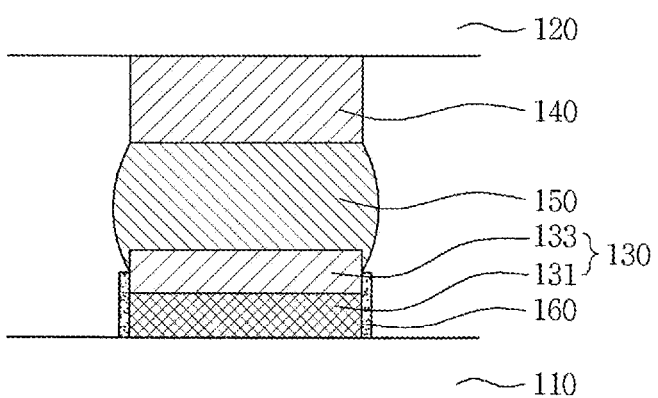
Figure 1G:
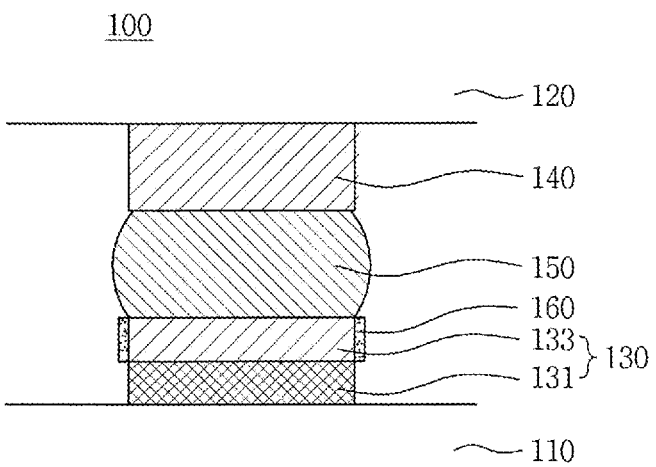
Figure 1H:
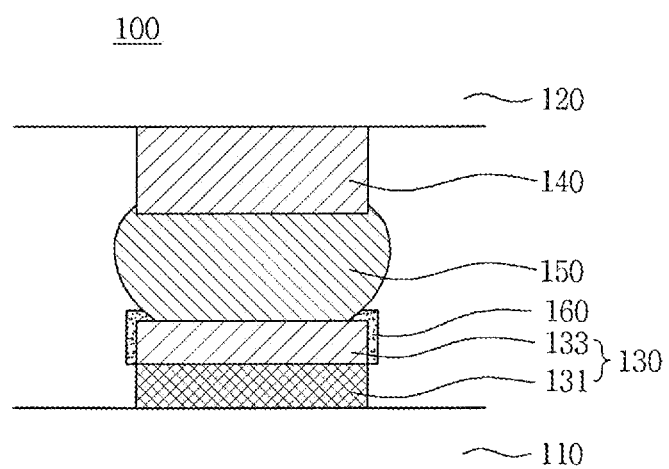

FIG. 1F depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130, portions of the lateral surfaces of the lower metal bump 130 and the bottom surface of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is disposed on the lateral surfaces of the first portion 131 of the lower metal bump 130 and on portions of the second portion 133 of the lower metal bump 130.

FIG. 1G depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130 and a portion of the bottom surface of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is not disposed on the lateral surface of the first portion 131 but disposed on the lateral surfaces of the second portion 133 of the lower metal bump 130.

FIG. 1H depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts a portion of the top surface of the lower metal bump 130, the bottom surface of the upper metal bump 140 and portions of the lateral surfaces of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is not disposed on the lateral surface of the first portion 131 but disposed on the lateral surfaces of the second portion 133 of the lower metal bump 130, and on a portion of the top surface of the second portion 133 of the lower metal bump 130.

Figure 1I:
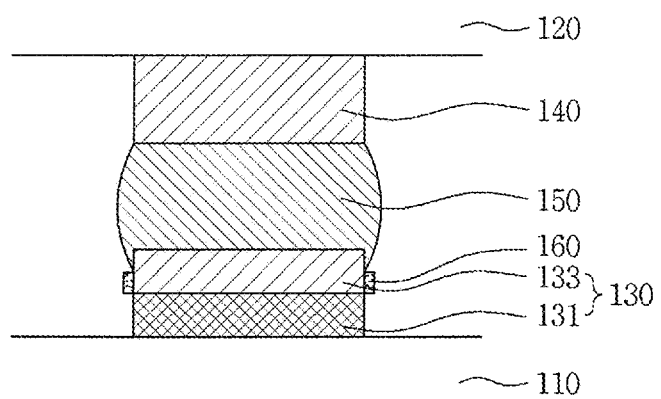

FIG. 1I depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130, portions of the lateral surfaces of the lower metal bump 130 and the bottom surface of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is not disposed on the lateral surface of the first portion 131 but disposed on portions of the lateral surfaces of the second portion 133 of the lower metal bump 130.

Figure 1J:
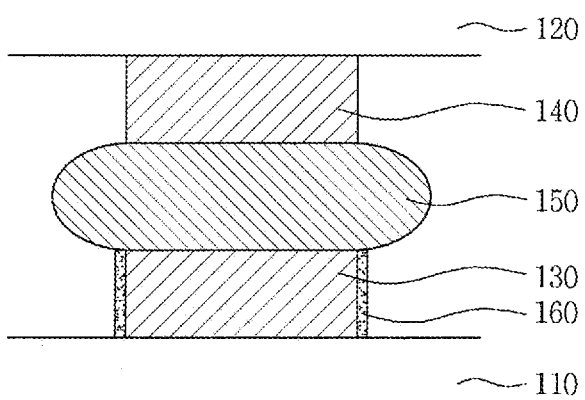

FIG. 1J depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130 and the bottom surface of the upper metal bump 140. Side portions of the solder unit 150 may protrude outward from lateral surfaces of the lower and upper bumps 130 and 140. A preservative film 160 (e.g., a preservative film of the inventive concept) is disposed on the lateral surfaces of the lower metal bump 130.

Figure 1K:
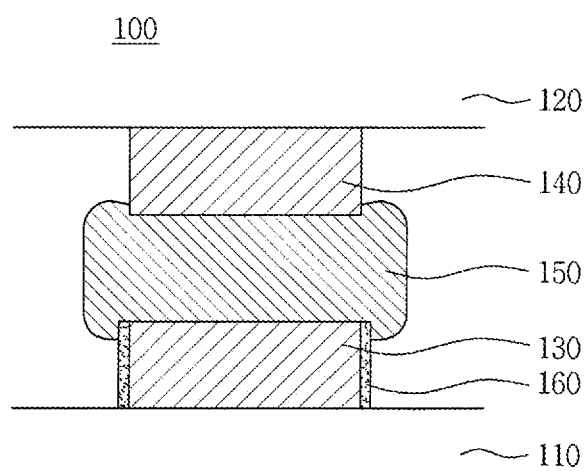

FIG. 1K depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130, portions of the lateral surfaces of the lower metal bump 130 (i.e., on portions of the lateral surfaces of the preservative film 160 overlying the lower metal bump 130), the bottom surface of the upper metal bump 140 and portions of the lateral surfaces of the upper metal bump 140. A preservative film 160 (e.g., a preservative film of the inventive concept) is disposed on the lateral surfaces of the lower metal bump 130.

Figure 1L:
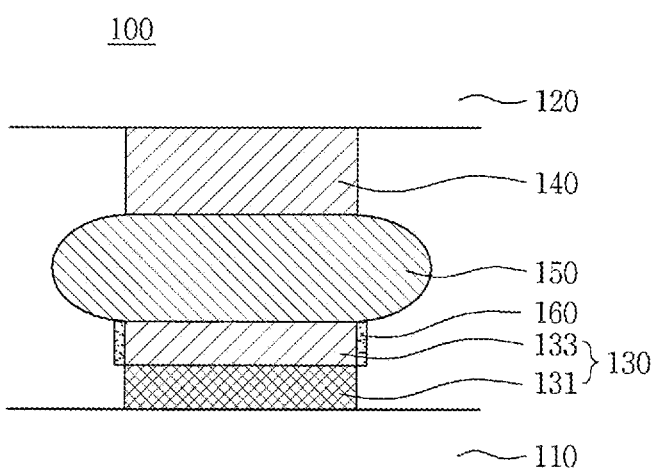

FIG. 1L depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130 and the bottom surface of the upper metal bump 140. Side portions of the solder unit 150 may protrude outward from lateral surfaces of the lower and upper bumps 130 and 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is not disposed on the lateral surface of the first portion 131 but disposed on the lateral surfaces of the second portion 133 of the lower metal bump 130.

Figure 1M:
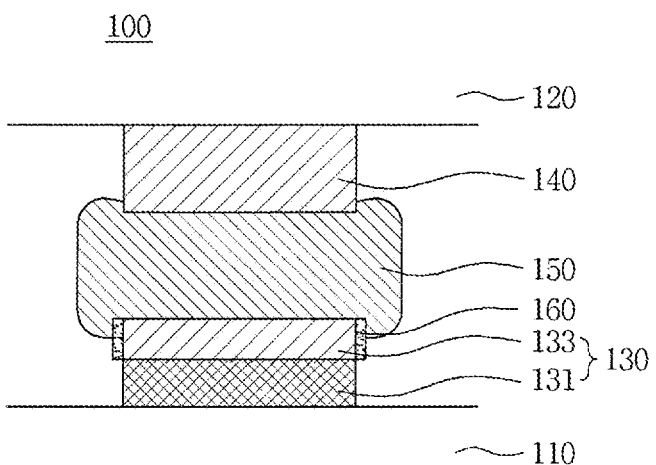

FIG. 1M depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130, portions of the lateral surfaces of the lower metal bump 130 (i.e., on portions of the lateral surfaces of the preservative film 160 overlying the lower metal bump 130), the bottom surface of the upper metal bump 140 and portions of the lateral surfaces of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is not disposed on the lateral surface of the first portion 131 but disposed on the lateral surfaces of the second portion 133 of the lower metal bump 130.

Figure 1N:
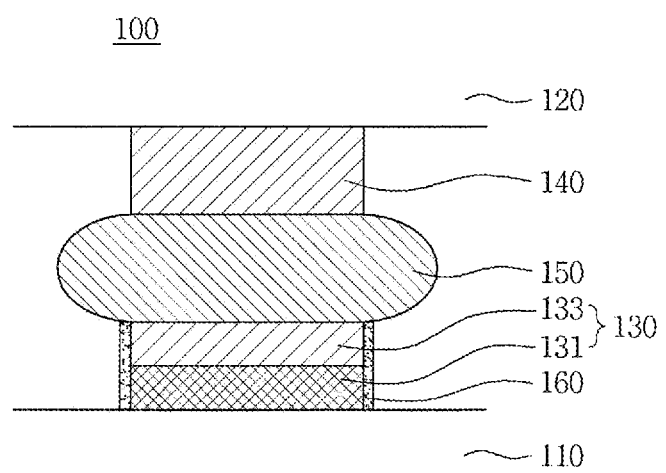

FIG. 1N depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130 and the bottom surface of the upper metal bump 140. Side portions of the solder unit 150 may protrude outward from lateral surfaces of the lower and upper bumps 130 and 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is disposed on the lateral surfaces of the first portion 131 of the lower metal bump 130 and on the lateral surfaces of the second portion 133 of the lower metal bump 130.

FIG. 1O depicts a solder joint structure according to some embodiments of the inventive concept. As shown therein, the solder joint structure 100 includes a soldering unit 150 interposed between a lower metal bump 130 disposed on a lower substrate 110 and an upper metal bump 140 disposed under an upper substrate 120. The soldering unit 150 contacts the top surface of the lower metal bump 130o, portions of the lateral surfaces of the lower metal bump 130 (i.e., on portions of the lateral surfaces of the preservative film 160 overlying the lower metal bump 130), the bottom surface of the upper metal bump 140 and portions of the lateral surfaces of the upper metal bump 140. The lower metal bump 130 includes a first portion 131 and a second portion 133, wherein the first portion 131 includes a first metal (e.g., nickel) and may be substantially free of a second metal (e.g., copper) and wherein the second portion 133 includes the second metal and may be substantially free of the first metal. A preservative film 160 (e.g., a preservative film of the inventive concept) is disposed on the lateral surfaces of the first portion 131 of the lower metal bump 130 and on the lateral surfaces of the second portion 133 of the lower metal bump 130.

Figure 2A:
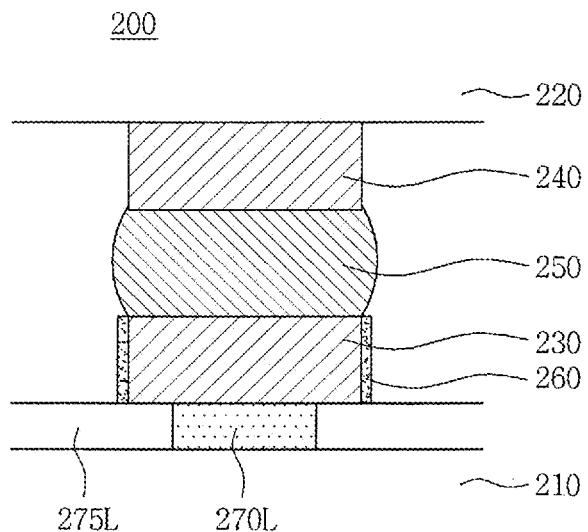
FIGS. 2A-2P are conceptual longitudinal sectional views of solder joint structures according to various embodiments of the inventive concept.
Figure 2B:
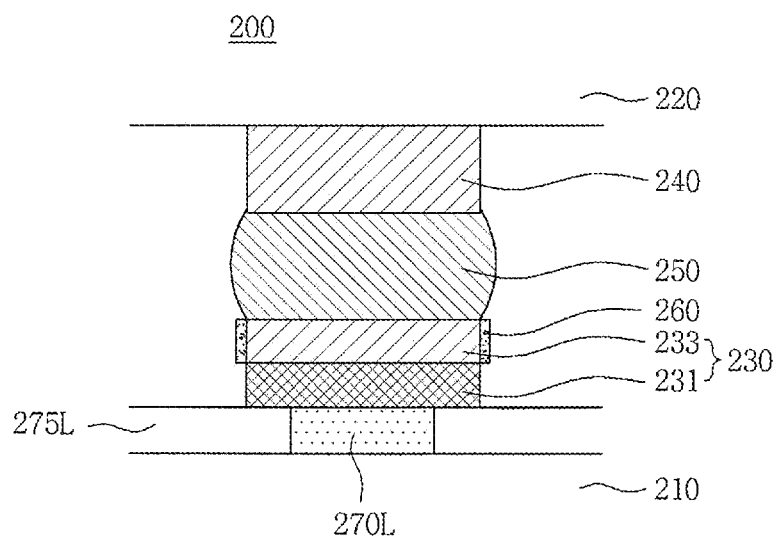
Figure 2C:
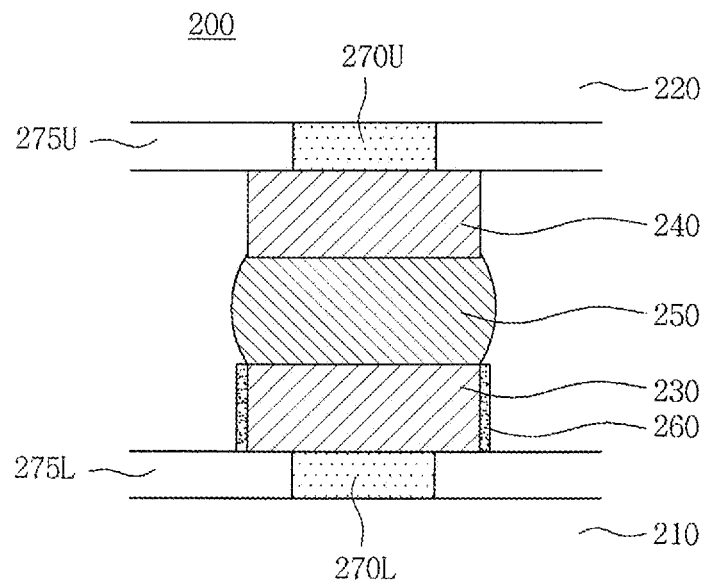
Figure 2D:
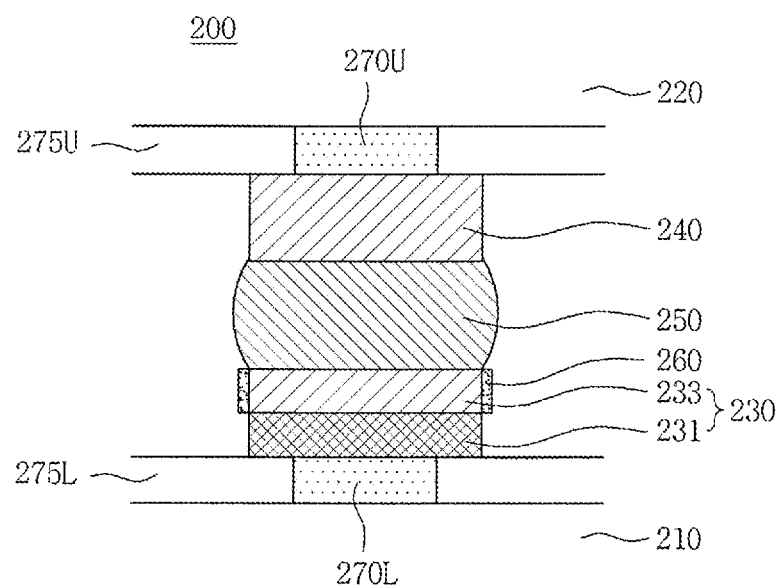
Figure 2E:
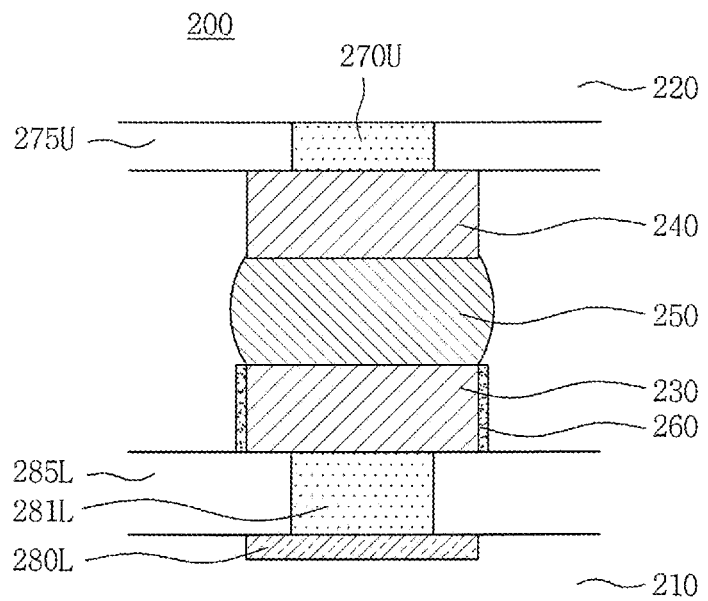
Figure 2F:
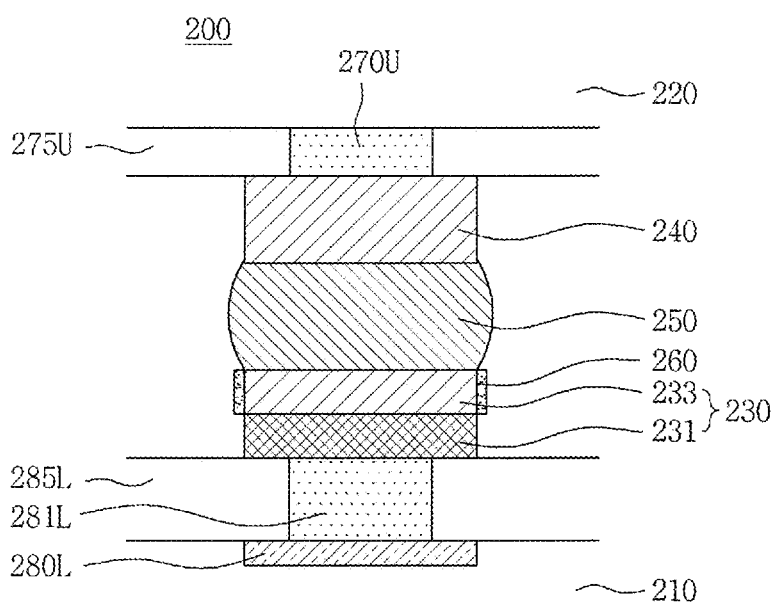
Figure 2G:
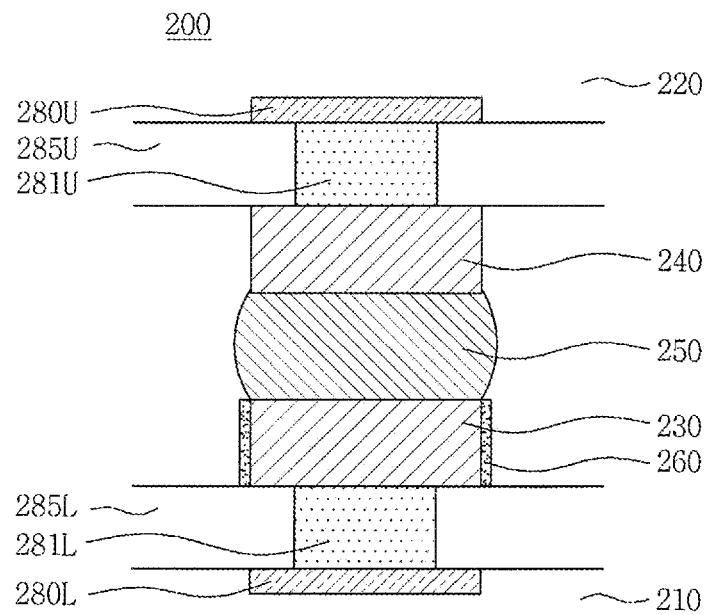
Figure 2H:
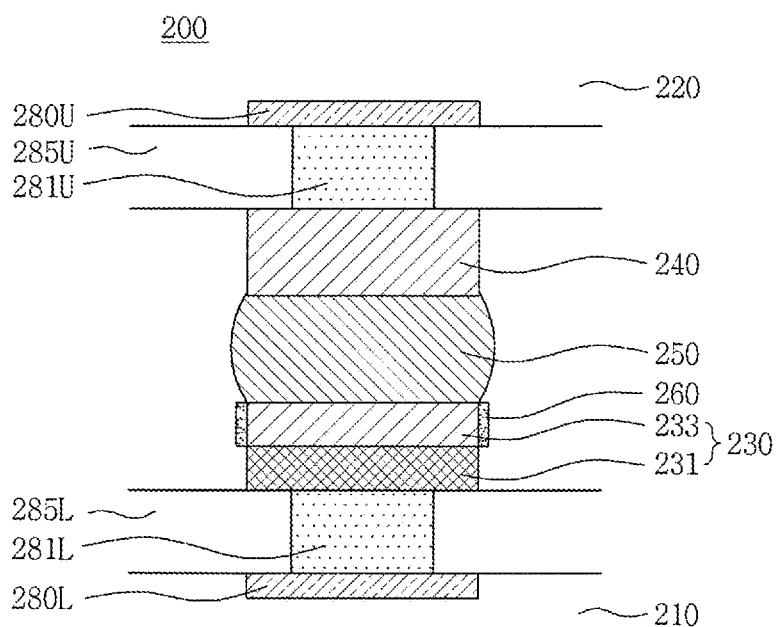
Figure 2I:
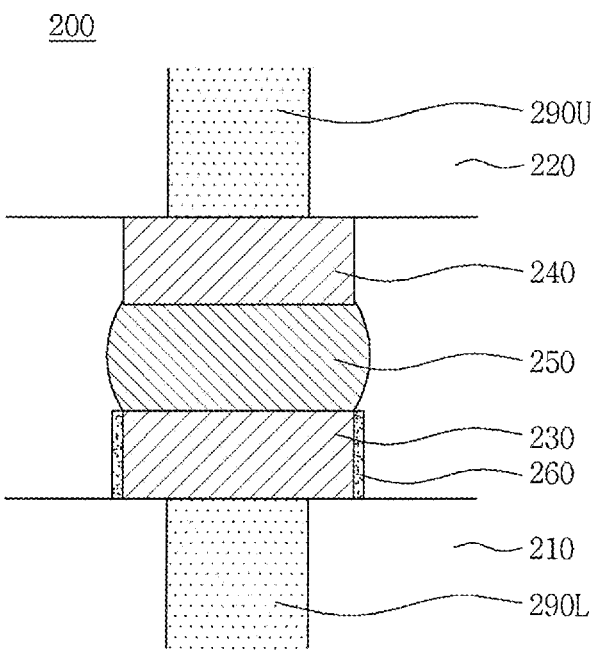
Figure 2J:
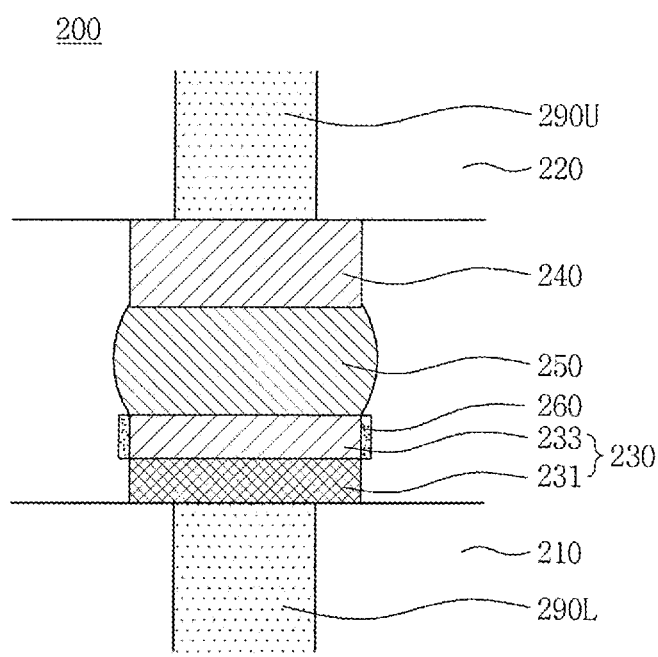
Figure 2K:
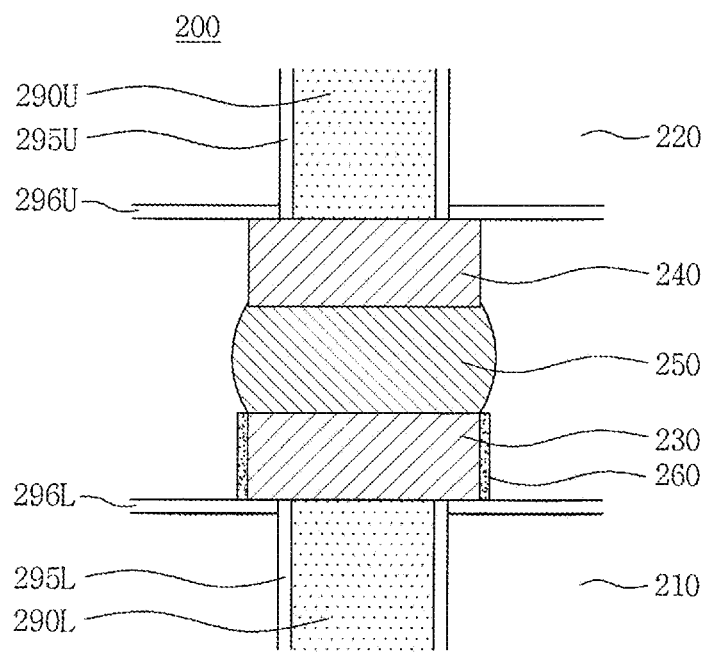
Figure 2L:
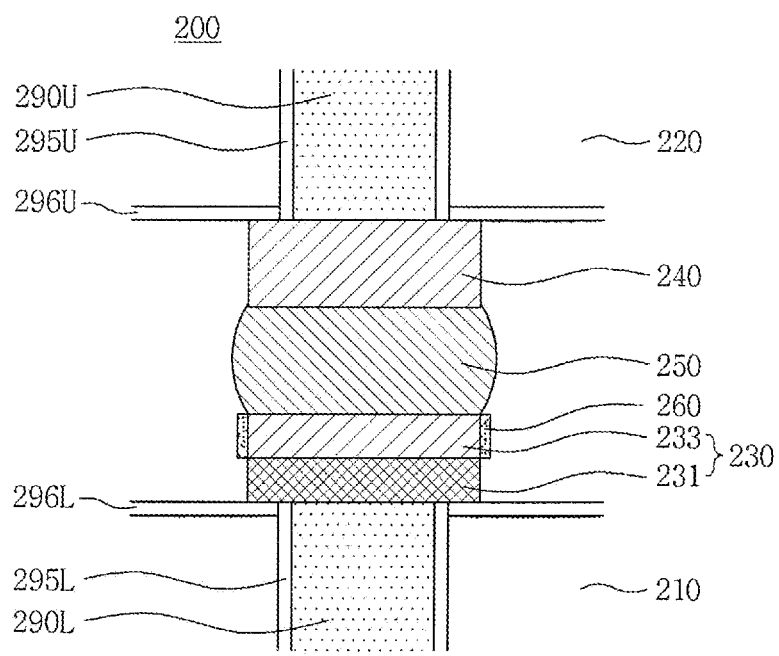
Figure 2M:
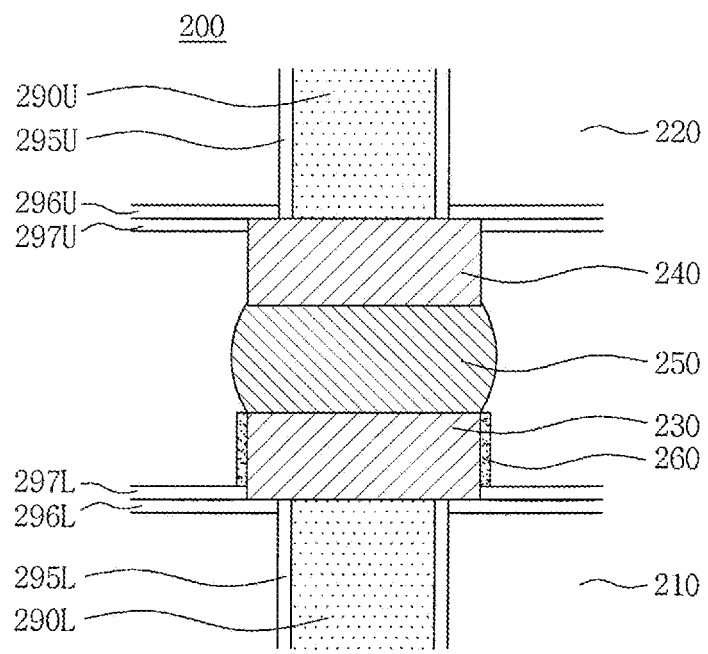
Figure 2N:
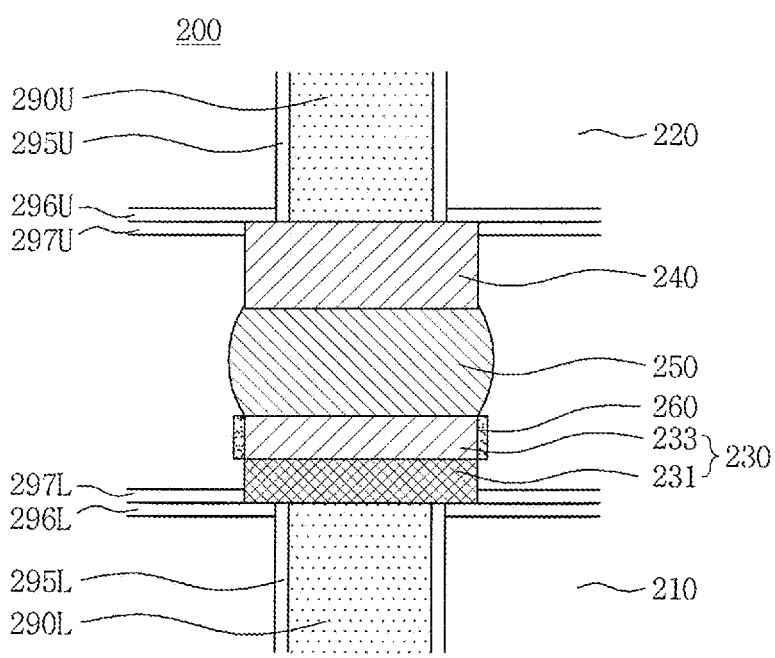
Figure 2O:
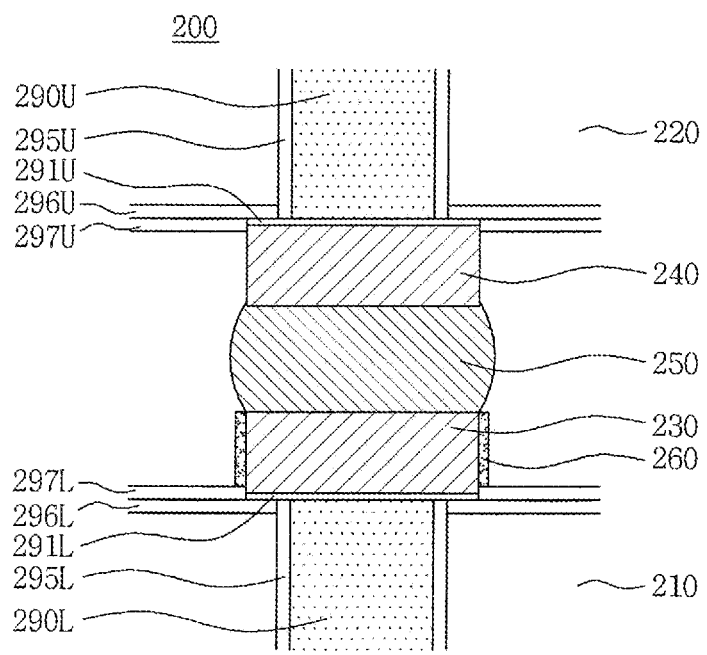
Figure 2P:
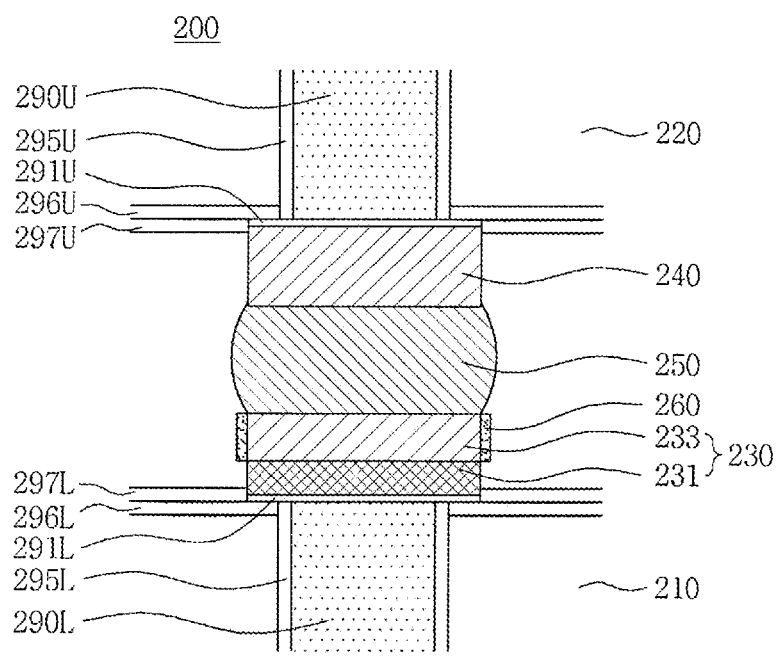

As shown in FIGS. 2A-2P, in some embodiments, a solder joint structure 200 of the inventive concept may include a lower metal bump 230 formed on a lower substrate 210, an upper metal bump 240 formed on an upper substrate 220 and a soldering unit 250 interposed therebetween. The solder joint structure 200 may further include one or more preservative films 260; one or more conductors 270, 280, 281, 290; one or more insulating materials 275, 285, 296, 297; one or more bottom layers 291 and/or one or more liners 295.

Each of the lower substrate 210 and upper substrate 220 may include any suitable substrate, including, but not limited to, a wafer, a semiconductor chip, a package substrate, a module board and a motherboard.

The lower metal bump 230 may include a first portion including a first metal and a second portion including a second metal, wherein the first and second metals are different. For example, as shown in FIGS. 2B, 2D, 2F, 2H, 2J, 2L, 2N and 2P, the lower metal bump 230 may include a metal bump including a first portion 231 including a first metal (e.g., nickel) and a second portion 233 including a second metal (e.g., copper), wherein the first portion 231 may be substantially free of the second metal and/or the second portion 233 may be substantially free of the first metal. In some such embodiments, the first portion 231 includes nickel and is substantially free of copper and the second portion 233 includes copper and is substantially free of nickel.

One or more conductors 270, 280, 281, 290 may be interposed between each of the lower substrate 210 and the upper substrate 220 and its corresponding metal bump. That is, one or more conductors 270, 280, 281, 290 may be interposed between and connect the lower substrate 210 and the lower metal bump 230 and/or one or more conductors 270, 280, 281 may be interposed between and connect the upper substrate 220 and the upper metal bump 240. The conductor(s) 270, 280, 281, 290 may be disposed in or on the lower substrate and my include any suitable conductor, including, but not limited to, metal interconnections, via plugs, redistribution structures, TSVs and/or metal pads. In some embodiments, two or more conductors are interposed between the lower bump 230 and the lower substrate 210 and/or between the upper metal bump 240 and the upper substrate 230. For example, in some embodiments, the lower substrate 210 is a wafer and the solder joint structure 200 includes a first lower conductor 280 including a metal interconnection and a second lower conductor 281 including a via plug, a pad or a redistribution structure. Similarly, in some embodiments, the lower substrate 210 is a PCB and the solder joint structure 200 includes a first lower conductor 280 including a metal interconnection or a metal plane of the PCB and a second lower conductor 281 including a via plug or a land of the PCB.

One or more bottom layers 291 may be interposed between each metal bump 230, 240 and the corresponding substrate 210, 220 and/or conductor(s) 270, 280, 281, 290. The bottom layer 291 may include any suitable material, including, but not limited to, nickel, copper and/or titanium. The bottom layer 291 may include one or more different materials as compared to the corresponding metal bump. In some embodiments, the bottom layer 291 includes a seed layer used to form the metal bump 230, 240.

An insulating material 275, 285, 296, 297 may be interposed between the lower metal bump 230 and the lower substrate 210 and/or between the upper metal bump 240 and the upper substrate 220.

The soldering unit 250 may contact any suitable surface of the lower metal bump 230 and the upper metal bump 240. For example, the soldering unit 250 may contact a portion of the top surface of the lower metal bump 230; the entire top surface of the lower metal bump 230 as shown in FIGS. 2A-2P; one or more of the lateral surfaces of the lower metal bump 230; a portion of the bottom surface of the upper metal bump 240; the entire bottom surface of the upper metal bump 240 as shown in FIGS. 2A-2P and/or one or more of the lateral surfaces of the upper metal bump 240 as shown in FIGS. 2A-2P.

A preservative film 260 (e.g., a preservative film of the inventive concept) may be formed on the lower metal bump 230. A preservative film 260 may be formed on any suitable surface(s) of the lower metal bump 230. In some embodiments, a preservative film is formed on two or more surfaces of the lower metal bump 230 and/or two or more surfaces of the upper metal bump 240. In some embodiments, a preservative film 260 is formed on at least a portion of the surface of the lower metal bump 230 that is to be coupled to the soldering unit 250 (and thereby to the upper metal bump 240). For example, a preservative film 260 may be formed on a portion of the top surface of the lower metal bump 230, wherein the top surface of the lower metal bump 230 is coupled to the soldering unit 250 (and thereby to the bottom surface). Likewise, a preservative film 260 may be formed on a portion of the lateral surfaces of the lower metal bump 230, wherein the lateral surfaces of the lower metal bump 230 are coupled to the soldering unit 250. In some embodiments, a preservative film is formed on at least a portion of the surface(s) that are not coupled to the soldering unit 250. For example, as shown in FIGS. 2A-2P, a preservative film 260 may be formed on the lateral surface(s) of the lower metal bump 230, wherein the lateral surfaces of the lower metal bump 230 are not coupled to the soldering unit 250.

In some embodiments, a preservative film 260 is selectively formed on one or more portions of the lower metal bump 230. For example, as shown in FIGS. 2B, 2D, 2F, 2H, 2J, 2L, 2N and 2P, a preservative film may be selectively formed on the second portion 233 of the lower metal bump 230 and not on the first portion 231 of the lower metal bump.

FIGS. 2A-2B each depict a solder joint structure according to some embodiments of the inventive concept. As shown therein, each solder joint structure 200 includes a soldering unit 250 interposed between a lower metal bump 230 disposed on a lower substrate 210 and an upper metal bump 240 disposed under an upper substrate 220. A lower conductor 270L is interposed between and connects the lower metal bump 230 and the lower substrate 210. The lateral surfaces of the lower conductor 270L are bounded by an insulating material 275L that is likewise interposed between the lower metal bump 230 and the lower substrate 210. The soldering unit 250 contacts the top surface of the lower metal bump 230, the bottom surface of the upper metal bump 240 and portions of the lateral surfaces of the upper metal bump 240. A preservative film 260 (e.g., a preservative film of the inventive concept) is disposed on the lateral surfaces of the lower metal bump 230.

As shown in FIG. 2B, the lower metal bump 230 may include a first portion 231 and a second portion 233, wherein the first portion 231 includes a first metal (e.g., nickel) and may be substantially free of a second metal (e.g., copper) and wherein the second portion 233 includes the second metal and may be substantially free of the first metal. In such embodiments, the preservative film 260 may be selectively formed on the second portion 233 of the lower metal bump 230 as shown.

FIGS. 2C-2D each depicts a solder joint structure according to some embodiments of the inventive concept. As shown therein, each solder joint structure 200 includes a soldering unit 250 interposed between a lower metal bump 230 disposed on a lower substrate 210 and an upper metal bump 240 disposed under an upper substrate 220. A lower conductor 270L is interposed between and connects the lower metal bump 230 and the lower substrate 210. The lateral surfaces of the lower conductor 270L are bounded by an insulating material 275L that is likewise interposed between the lower metal bump 230 and the lower substrate 210. An upper conductor 270U is interposed between and connects the upper metal bump 240 and the upper substrate 220. The lateral surfaces of the upper conductor 270U are bounded by an insulating material 275U that is likewise interposed between the upper metal bump 240 and the upper substrate 220. The soldering unit 250 contacts the top surface of the lower metal bump 230, the bottom surface of the upper metal bump 240 and portions of the lateral surfaces of the upper metal bump 240. A preservative film 260 (e.g., a preservative film of the inventive concept) is disposed on the lateral surfaces of the lower metal bump 230.

As shown in FIG. 2D, the lower metal bump 230 may include a first portion 231 and a second portion 233, wherein the first portion 231 includes a first metal (e.g., nickel) and may be substantially free of a second metal (e.g., copper) and wherein the second portion 233 includes the second metal and may be substantially free of the first metal. In such embodiments, the preservative film 260 may be selectively formed on the second portion 233 of a lower metal bump 230 as shown.

FIGS. 2E-2F each depict a solder joint structure according to some embodiments of the inventive concept. As shown therein, each solder joint structure 200 includes a soldering unit 250 interposed between a lower metal bump 230 disposed on a lower substrate 210 and an upper metal bump 240 disposed under an upper substrate 220. A first lower conductor 280L and a second lower conductor 281L are interposed between and connect the lower metal bump 230 and the lower substrate 210. The first lower conductor 280L is embedded in the surface of the lower substrate 210. The second lower conductor 281L is disposed on the surface of the first lower conductor 280L and its lateral surfaces are bounded by an insulating material 285L that is interposed between the lower metal bump 230 and the lower substrate 210. An upper conductor 270U is interposed between and connects the upper metal bump 240 and the upper substrate 220. The lateral surfaces of the upper conductor 270U are bounded by an insulating material 275U that is likewise interposed between the upper metal bump 240 and the upper substrate 220. The soldering unit 250 contacts the top surface of the lower metal bump 230, the bottom surface of the upper metal bump 240 and portions of the lateral surfaces of the upper metal bump 240. A preservative film 260 (e.g., a preservative film of the inventive concept) is disposed on the lateral surfaces of the lower metal bump 230.

As shown in FIG. 2F, the lower metal bump 230 may include a first portion 231 and a second portion 233, wherein the first portion 231 includes a first metal (e.g., nickel) and may be substantially free of a second metal (e.g., copper) and wherein the second portion 233 includes the second metal and may be substantially free of the first metal. In such embodiments, the preservative film 260 may be selectively formed on the second portion 233 of a lower metal bump 230 as shown.

FIGS. 2G-2H each depicts a solder joint structure according to some embodiments of the inventive concept. As shown therein, each solder joint structure 200 includes a soldering unit 250 interposed between a lower metal bump 230 disposed on a lower substrate 210 and an upper metal bump 240 disposed under an upper substrate 220. A first lower conductor 280L and a second lower conductor 281L are interposed between and connect the lower metal bump 230 and the lower substrate 210. The first lower conductor 280L is embedded in the surface of the lower substrate 210. The second lower conductor 281L is disposed on the surface of the first lower conductor 280L and its lateral surfaces are bounded by an insulating material 285L that is interposed between the lower metal bump 230 and the lower substrate 210. A first upper conductor 280U and a second upper conductor 281U are interposed between and connect the upper metal bump 240 and the upper substrate 220. The first upper conductor 280U is embedded in the surface of the upper substrate 220. The second upper conductor 281U is disposed on the surface of the first upper conductor 280U and its lateral surfaces are bounded by an insulating material 285U that is interposed between the upper metal bump 240 and the upper substrate 220. The soldering unit 250 contacts the top surface of the lower metal bump 230, the bottom surface of the upper metal bump 240 and portions of the lateral surfaces of the upper metal bump 240. A preservative film 260 (e.g., a preservative film of the inventive concept) is disposed on the lateral surfaces of the lower metal bump 230.

As shown in FIG. 2H, the lower metal bump 230 may include a first portion 231 and a second portion 233, wherein the first portion 231 includes a first metal (e.g., nickel) and may be substantially free of a second metal (e.g., copper) and wherein the second portion 233 includes the second metal and may be substantially free of the first metal. In such embodiments, the preservative film 260 may be selectively formed on the second portion 233 of a lower metal bump 230 as shown.

FIGS. 2I-2J each depicts a solder joint structure according to some embodiments of the inventive concept. As shown therein, each solder joint structure 200 includes a soldering unit 250 interposed between a lower metal bump 230 disposed on a lower substrate 210 and an upper metal bump 240 disposed under an upper substrate 220. A lower via plug 290L is formed in the lower substrate 210 and is connected to the lower metal bump 230. An upper via plug 290U is formed in the upper substrate 220 and is connected to the upper metal bump 240. Each of the lower via plug 290L and the upper via plug 290U may have a pillar shape and/or may include a TSV. The soldering unit 250 contacts the top surface of the lower metal bump 230, the bottom surface of the upper metal bump 240 and portions of the lateral surfaces of the upper metal bump 240. A preservative film 260 (e.g., a preservative film of the inventive concept) is disposed on the lateral surfaces of the lower metal bump 230.

As shown in FIG. 2J, the lower metal bump 230 may include a first portion 231 and a second portion 233, wherein the first portion 231 includes a first metal (e.g., nickel) and may be substantially free of a second metal (e.g., copper) and wherein the second portion 233 includes the second metal and may be substantially free of the first metal. In such embodiments, the preservative film 260 may be selectively formed on the second portion 233 of a lower metal bump 230 as shown.

FIGS. 2K-2P each depict a solder joint structure according to some embodiments of the inventive concept. As shown therein, each solder joint structure 200 includes a soldering unit 250 interposed between a lower metal bump 230 disposed on a lower substrate 210 and an upper metal bump 240 disposed under an upper substrate 220. A lower insulating material 296L is interposed between the top surface of the lower substrate 210 and the lower metal bump 230, and an upper insulating material 296U is interposed between the bottom surface of the upper substrate 220 and the upper metal bump 240. A lower via plug 290L is formed in the lower substrate 210, is connected to the lower metal bump 230 and is surrounded on its lateral surfaces by a lower liner 295L. An upper via plug 290U is formed in the upper substrate 220, is connected to the upper metal bump 240 and is surrounded on its lateral surfaces by an upper liner 295U. Each of the lower via plug 290L and the upper via plug 290U may have a pillar shape and/or may include a TSV. Each of the lower liner 295L and the upper liner 295U may include an insulating material (e.g., silicon oxide, silicon nitride and/or silicon oxynitride), a conductive material and/or a barrier material (e.g., titanium, titanium nitride, tantalum nitride and/or a refractory metal). In some embodiments, the liners 295L, 295U and the insulating materials 296L, 296U include one or more of the same materials. The soldering unit 250 contacts the top surface of the lower metal bump 230, the bottom surface of the upper metal bump 240 and portions of the lateral surfaces of the upper metal bump 240. A preservative film 260 (e.g., a preservative film of the inventive concept) is disposed on the lateral surfaces of the lower metal bump 230.

As shown in FIGS. 2M-2N, the solder joint structure 200 may include a second lower insulating material 297L on the surface of the lower insulating material 296L and surrounding portions of the lateral surfaces of the lower metal bump 230 and/or a second upper insulating material 297U on the surface of the upper insulating material 296U and surrounding portions of the lateral surfaces of the upper metal bump 240. In some embodiments, the second lower insulating material 297L and/or the second upper insulating material 297U includes one or more different insulating materials as compared to the underlying insulating layer 296L, 297L.

As shown in FIGS. 2O-2P, the solder joint structure 200 may include a lower bottom layer 291L interposed between the lower metal bump 230 and the lower substrate 210 and/or an upper bottom layer 291U interposed between the upper metal bump 240 and the upper substrate 220. Each of the bottom layers 291L, 291U may include a seed layer used to form the metal bumps 230, 240. In some embodiments, the lower bottom layer 291L and/or the upper bottom layer 291U includes one or more different materials as compared to the corresponding metal bump 230, 240 (e.g., the bottom layer may include copper and/or titanium and the metal bump may include nickel and/or copper).

As shown in FIGS. 2L, 2N and 2P, the lower metal bump 230 may include a first portion 231 and a second portion 233, wherein the first portion 231 includes a first metal (e.g., nickel) and may be substantially free of a second metal (e.g., copper) and wherein the second portion 233 includes the second metal and may be substantially free of the first metal. In such embodiments, the preservative film 260 may be selectively formed on the second portion 233 of a lower metal bump 230 as shown.

As will be appreciated by one of skill in the art, many modifications may be made to the particular embodiments described above without materially departing from the inventive concept. For example, one or more of the features described above with respect to one of embodiments depicted in FIGS. 1A-2P may combined with the features of another of the depicted embodiments to form a different embodiment of the inventive concept. Likewise, one or more of the features described above with respect to one of the embodiments depicted above with respect to one of the embodiments depicted in FIGS. 1A-2P may be removed from that embodiment or otherwise modified. All such modifications are included within the scope of the inventive concept.

Device stack structures may include one or more unit devices and one or more solder joint structures.

Device stack structures of the inventive concept may include any suitable unit device, including, but not limited to, unit devices including a semiconductor chip, a packaged semiconductor device, a wafer and/or a unit package.

Device stack structures of the inventive concept may include any suitable solder joint structure, including, but not limited to, solder joint structures of the inventive concept. In some embodiments, one or more of the solder joint structures includes a preservative film (e.g., a preservative film of the inventive concept).

Device stack structures of the inventive concept may further include any suitable substrate, including, but not limited to, substrates including a package substrate, a PCB, a module board and/or a motherboard. In some embodiments, the device stack structure includes a lower substrate and/or an upper substrate.

Device stack structures of the inventive concept may further include any suitable wire bonding structure, including, but not limited to, wire bonding structures including I/O pads, bonding fingers and/or bonding wires.

Device stack structures of the inventive concept may be formed using any suitable method.

As shown in FIGS. 3A-3D, in some embodiments, a device stack structure 300 may include a plurality of unit devices 310A, 310B, 310C, 310D and a plurality of solder joint structures 320 (e.g., solder joint structures of the inventive concept) disposed therebetween. In some embodiments, one or more solder joint structures may be disposed on the top surface of the uppermost unit device 310D and/or on the bottom surfaced of the lowermost unit device 310A.

Figure 3A:
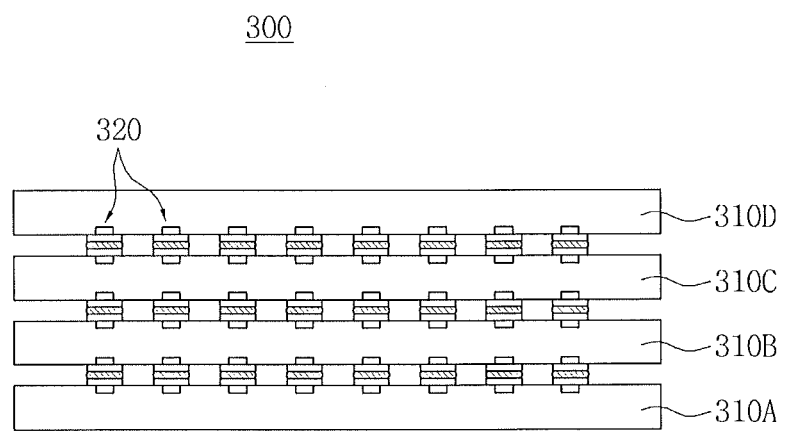
FIGS. 3A-3D are conceptual lateral views or longitudinal sectional views of device stack structures according to various embodiments of the inventive concept.
Figure 3B:
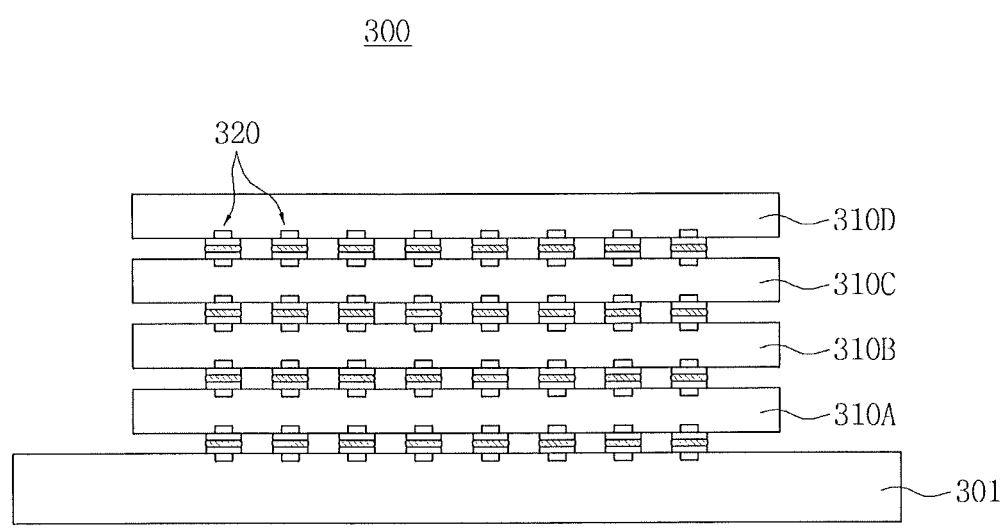
Figure 3C:
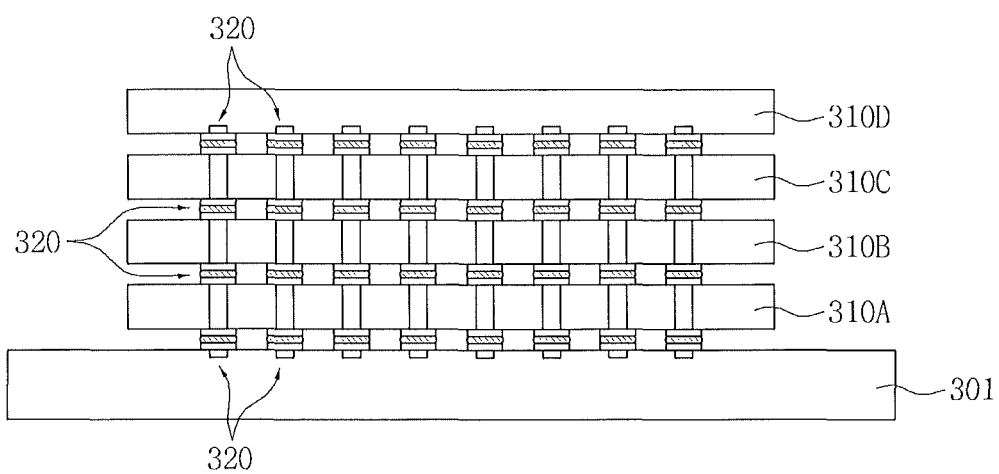
Figure 3D:
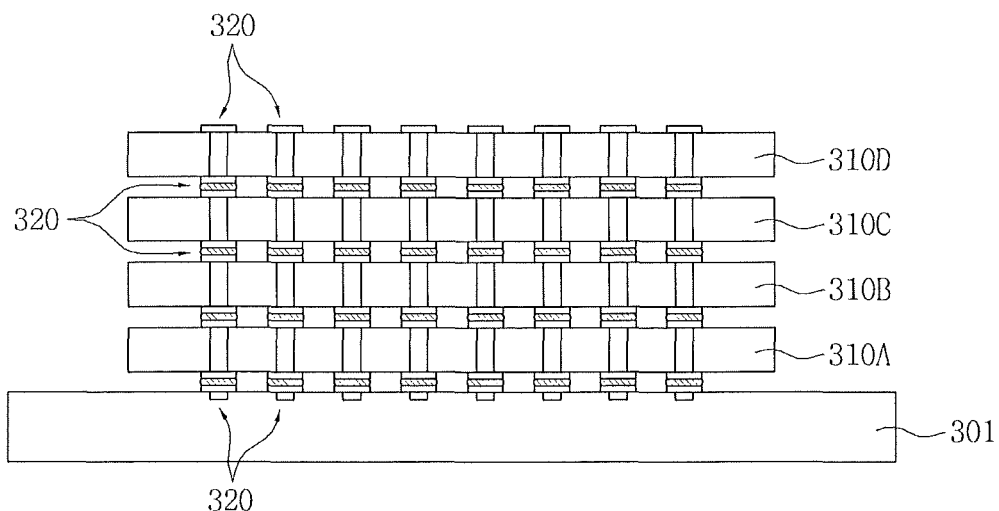

As shown in FIGS. 3B-3D, the device stack structure 300 may include a lower substrate 301 that is connected to the lowermost unit device 310A by a plurality of solder joint structures (e.g., solder joint structures of the inventive concept). In some such embodiments, the lower substrate 301 is a PCB.

As shown in FIGS. 3C-3D, the device stack structure 300 may include solder joint structures 320 that are connected by virtue of sharing one or more common conductors (e.g., a TSV). In such embodiments, two or more solder joint structures 320 may be connected in series (e.g., by a series of TSVs that pass through the unit devices interposed between the metal bumps of the solder joint structures).

As shown in FIG. 3D, one or more of the uppermost solder joint structures 320 may include a conductor that passes through the uppermost unit device 310D and provides a surface whereby the uppermost solder joint structure 320 may be connected to one or more additional components.

As will be appreciated by one of skill in the art, many modifications may be made to the particular embodiments described above without materially departing from the inventive concept. For example, one or more of the features described above with respect to one of embodiments depicted in FIGS. 3A-3D may combined with the features of another of the depicted embodiments to form a different embodiment of the inventive concept. Likewise, One or more of the features described above with respect to one of the embodiments depicted above with respect to one of the embodiments depicted in FIGS. 3A-3D may be removed from that embodiment or otherwise modified. All such modifications are included within the scope of the inventive concept.

Package stack structures may include a substrate, one or more unit devices and one or more solder joint structures.

Package stack structures of the inventive concept may include any suitable substrate, including, but not limited to, substrates including a package substrate, a PCB, a module board and/or a motherboard. In some embodiments, the device stack structure includes multiple substrates (e.g., a lower substrate and an upper substrate).

Package stack structures of the inventive concept may include any suitable unit device, including, but not limited to, unit devices including a semiconductor chip, a packaged semiconductor device, a wafer and/or a unit package. In some embodiments, the unit device includes a logic device (e.g., a microprocessor) and/or a memory device (e.g., an I/O memory device).

Package stack structures of the inventive concept may include any suitable solder joint structure, including, but not limited to, solder joint structures of the inventive concept. In some embodiments, one or more of the solder joint structures includes a preservative film (e.g., a preservative film of the inventive concept).

Package stack structures of the inventive concept may further include any suitable wire bonding structure, including, but not limited to, wire bonding structures including I/O pads, bonding fingers and/or bonding wires. In some embodiments, a wire bonding structure connects one or more semiconductor devices to a substrate. For example, a bonding wire may be used to connect an I/O pad disposed in/on a semiconductor device to a bonding finger disposed in/on a substrate.

Package stack structures of the inventive concept may further include any suitable die-bonding film, including, but not limited to, die-bonding films including gold alloy and epoxy resins. In some embodiments, one or more semiconductor devices is bonded to a substrate using a die-bonding film.

Package stack structures of the inventive concept may be formed using any suitable method, including, but not limited to, a flip-chip bonding technique.

Figure 4A:
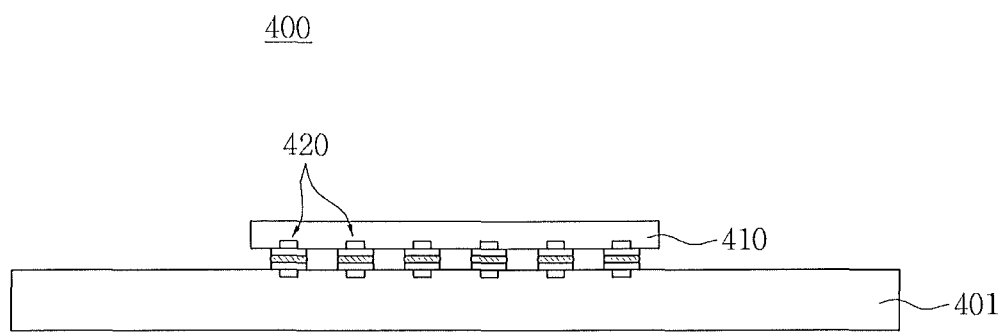
FIGS. 4A-4E are conceptual lateral views or longitudinal sectional views of package stack structures according to various embodiments of the inventive concept.
Figure 4B:
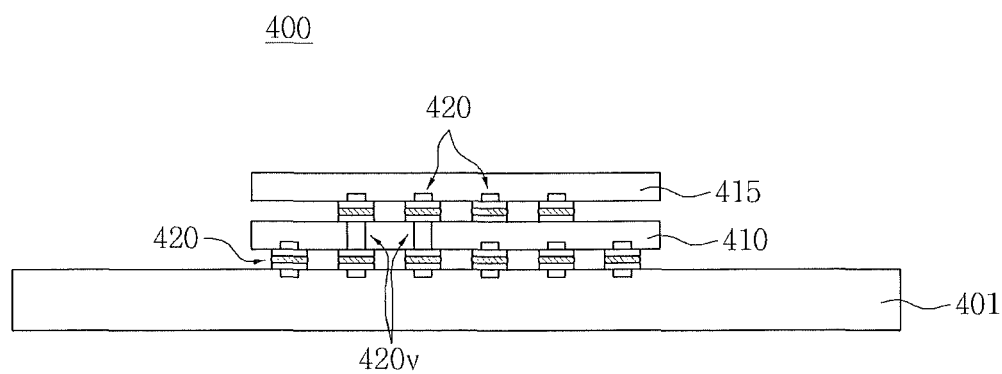

As shown in FIGS. 4A-4B, in some embodiments, a package stack structure 400 may include a substrate 401, one or more unit devices 410, 415 and a plurality of solder joint structures 420 (e.g., solder joint structures of the inventive concept) disposed therebetween.

As shown in FIG. 4B, the package stack structure 400 may include a plurality of unit devices 410, 415 disposed on the substrate 401, wherein one or more solder joint structures 420 is interposed between the substrate 401 and the lowermost unit device 410 and one or more solder joint structures 420 is interposed between the lowermost unit device 410 and the uppermost unit device 415. In such embodiments, each of the unit devices 410, 415 may include a logic device and/or a memory device. For example, in some such embodiments, the lowermost unit device 410 includes a logic device and the uppermost unit device 415 includes a memory device (e.g., a wide I/O memory device).

Also as shown in FIG. 4B, package stack structure 400 may include solder joint structures 420 that are connected by virtue of sharing one or more common conductors 420v (e.g., a TSV).

Figure 4C:
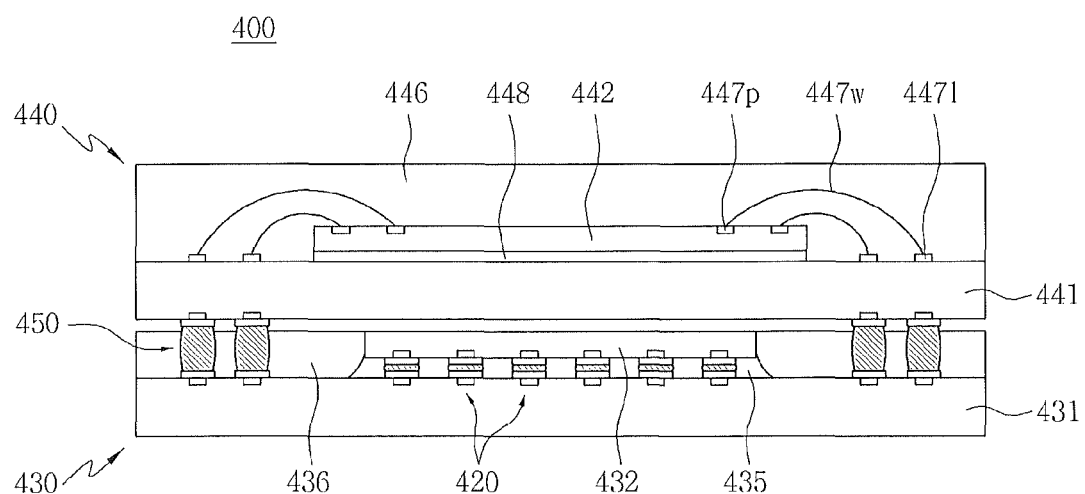
Figure 4D:
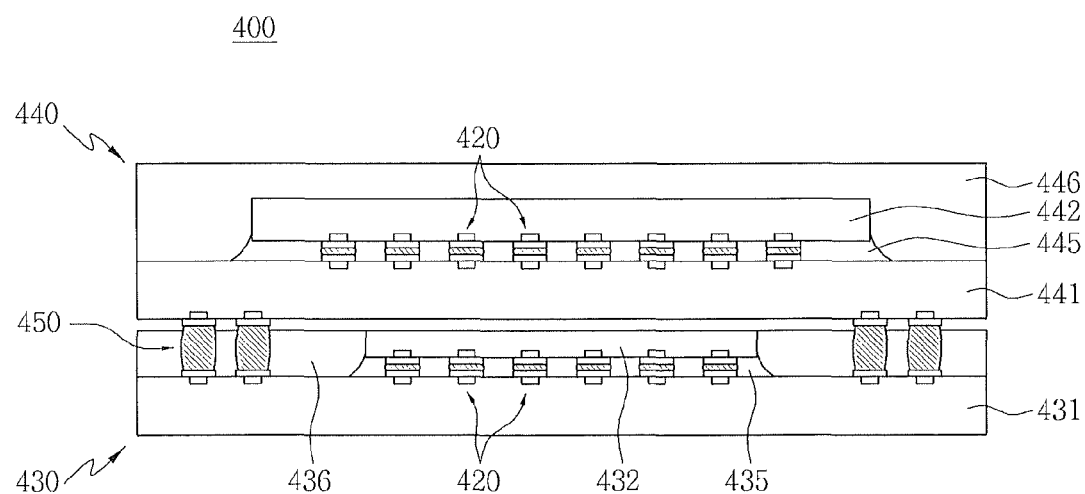
Figure 4E:
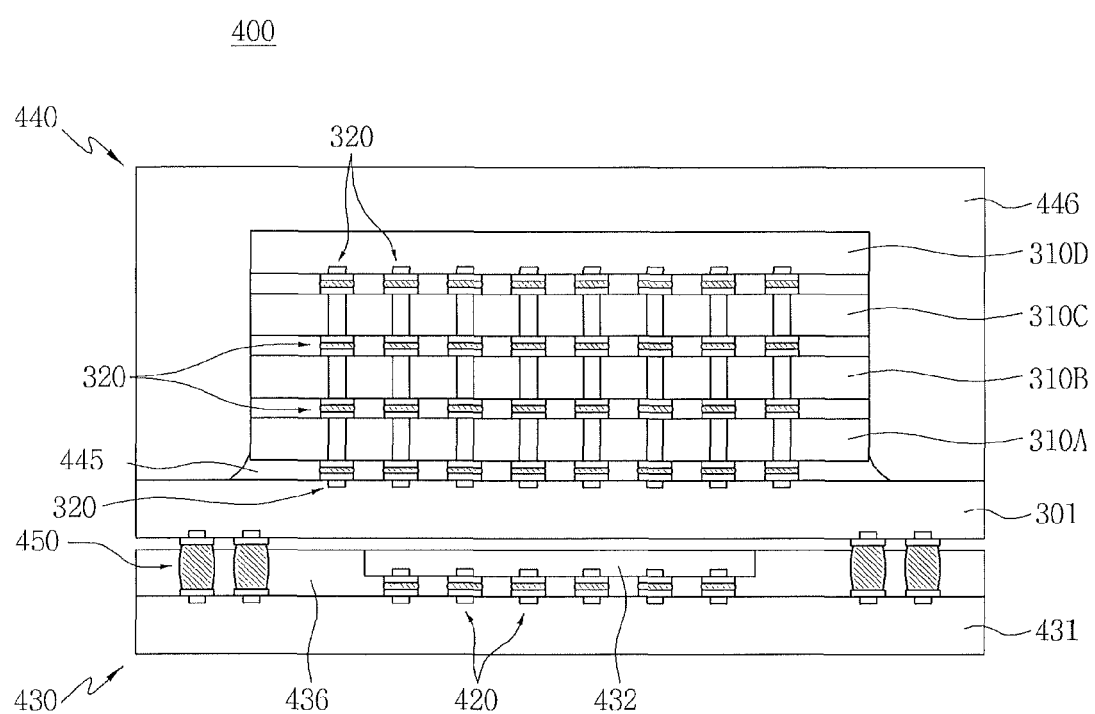

As shown in FIGS. 4C-4E, in some embodiments, a package stack structure 400 may include a lower package 430 that is connected to an upper package 440 by a plurality of inter-package connectors 450. Each of the inter-package connectors 450 may include a solder joint structure 420 (e.g., a solder joint structure of the inventive concept). Each of the lower package 430 and the upper package 440 may include any suitable package stack structure (e.g., a package stack structure as described above with respect to FIGS. 9A-9B).

As shown in FIGS. 4C-4D, each of the lower package 430 and the upper package 440 includes a semiconductor device 432, 442 connected to a substrate 431, 441. by a plurality of solder joint structures 420 (e.g., solder joint structures of the inventive concept) or a plurality of wire bonding structures 447 (i.e., a bonding wire 447w that connects an I/O pad 447p disposed in/on the surface of the semiconductor device and a bonding land 447l disposed in/on the surface of the substrate). The semiconductor device 442 of the upper package 440 is disposed on and bonded to the upper package substrate 441c using a die-bonding film 448.

Also as shown in FIGS. 4C-4D, each of the lower package 430 and the upper package 440 includes various filling materials. For example, an underfill material 435, 445 surrounds the lateral surfaces of the solder joint structures 420, and a molding material 436, 446 surrounds the lateral surfaces of one or more of the inter-package connectors 450 as well as the top and/or lateral surfaces of the semiconductor devices 432, 442.

As shown in FIG. 4E, in some embodiments, a package stack structure 400 may include a lower package 430 as described above with respect to FIGS. 4C-4D and an upper package 440 that includes a device stack structure as described above with respect to FIG. 3C, wherein the device stack structure further includes an underfill material 445 that surrounds the lateral surfaces of the solder joint structures 420 and a molding material 446 that surrounds the top and lateral surfaces of the device stack structure.

As will be appreciated by one of skill in the art, many modifications may be made to the particular embodiments described above without materially departing from the inventive concept. For example, one or more of the features described above with respect to one of embodiments depicted in FIGS. 4A-4E may combined with the features of another of the depicted embodiments to form a different embodiment of the inventive concept. Likewise, one or more of the features described above with respect to one of the embodiments depicted above with respect to one of the embodiments depicted in FIGS. 4A-4E may be removed from that embodiment or otherwise modified. All such modifications are included within the scope of the inventive concept.

Package mounting structures may include a substrate, a semiconductor package and one or more solder joint structures.

Package mounting structures of the inventive concept may further include any suitable substrate, including, but not limited to, substrates including a PCB, a module board and/or a motherboard. In some embodiments, the device stack structure includes a lower substrate and/or an upper substrate.

Package mounting structures of the inventive concept may include any suitable semiconductor package, including, but not limited to, semiconductor packages including a device stack structure (e.g., a device stack structure of the inventive concept) and/or a package stack structure (e.g., a package stack structure of the inventive concept).

Package mounting structures of the inventive concept may include any suitable solder joint structure, including, but not limited to, solder joint structures of the inventive concept. In some embodiments, one or more of the solder joint structures includes a preservative film (e.g., a preservative film of the inventive concept).

Package mounting structures of the inventive concept may be formed using any suitable method.

As shown in FIGS. 5A-5D, in some embodiments, a package mounting structure 500 may a substrate 501, a semiconductor package 510 and a plurality of solder joint structures 520 (e.g., solder joint structures of the inventive concept) disposed therebetween.

Figure 5A:
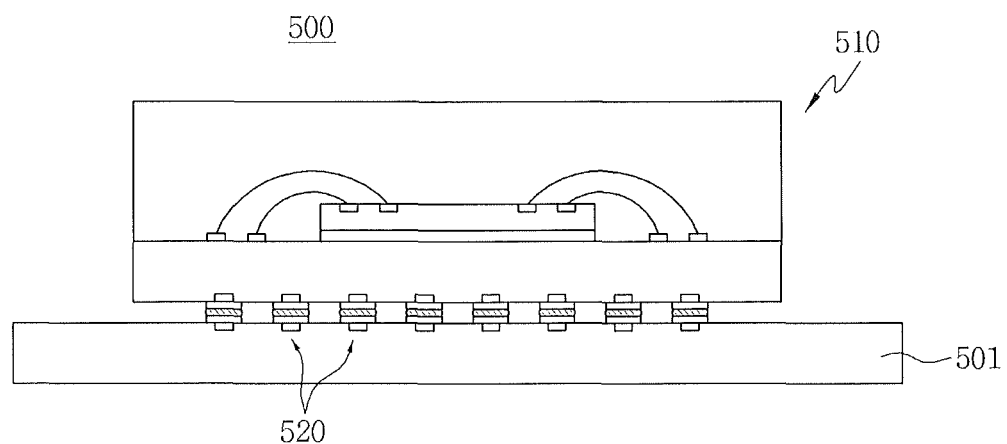
FIGS. 5A-5D are conceptual lateral views or longitudinal sectional views of package mouting structures according to various embodiments of the inventive concept.

FIG. 5A depicts a package mounting structure 500 according to some embodiments of the inventive concept. As shown therein, the semiconductor package 510 includes an upper package as described above with respect to FIG. 4C.

Figure 5B:
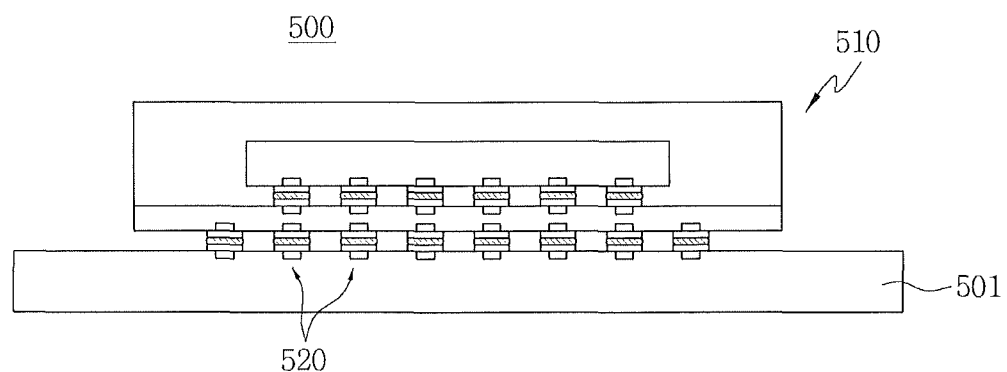

FIG. 5B depicts a package mounting structure 500 according to some embodiments of the inventive concept. As shown therein, the semiconductor package 510 includes a package stack structure as described above with respect to FIG. 4A, wherein the package stack structure further includes a filling material that surrounds the lateral surfaces of the solder joint structures 520 and the top and lateral surfaces of the unit device.

Figure 5C:
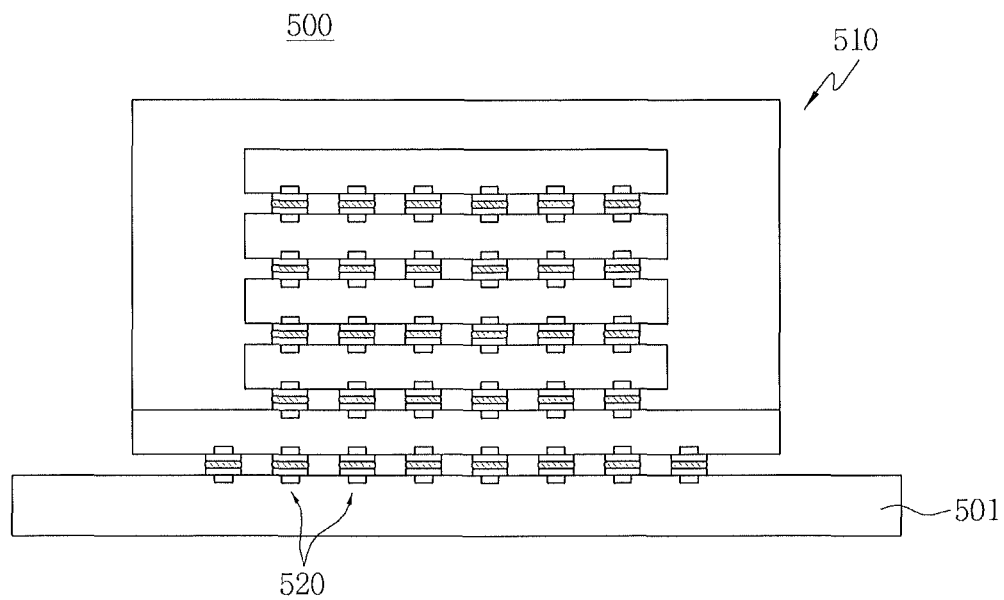

FIG. 5C depicts a package mounting structure 500 according to some embodiments of the inventive concept. As shown therein, the semiconductor package 510 includes a device stack structure as describe above with respect to FIG. 3B, wherein the device stack structure further includes a filling material that surrounds the lateral surfaces of the solder joint structures 520 and the top and lateral surfaces of the unit device.

Figure 5D:
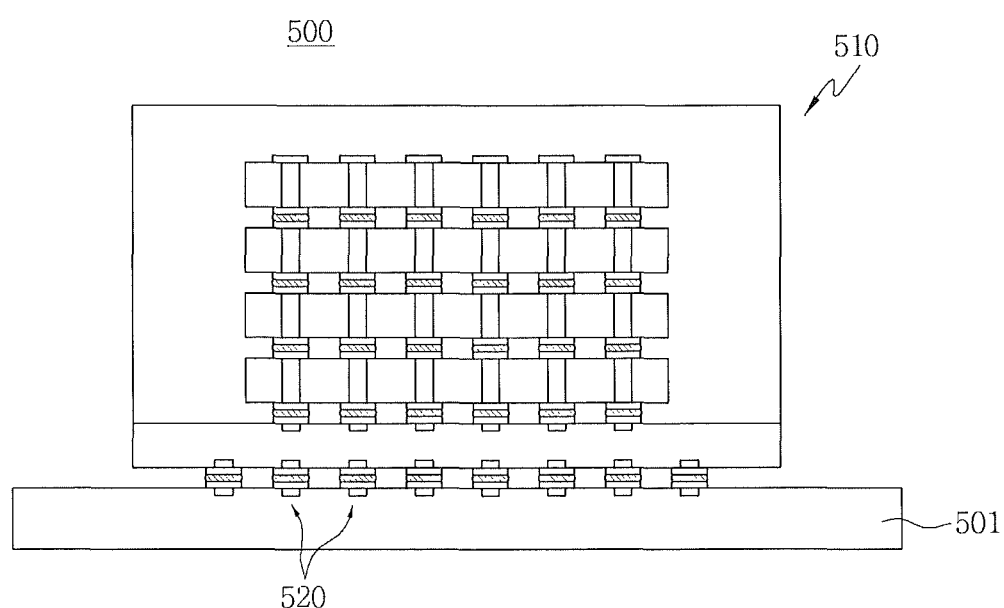

FIG. 5D depicts a package mounting structure 500 according to some embodiments of the inventive concept. As shown therein, the semiconductor package 510 includes a device stack structure as describe above with respect to FIG. 3D, wherein the device stack structure further includes a filling material that surrounds the lateral surfaces of the solder joint structures 520 and the top and lateral surfaces of the unit device.

As will be appreciated by one of skill in the art, many modifications may be made to the particular embodiments described above without materially departing from the inventive concept. For example, one or more of the features described above with respect to one of embodiments depicted in FIGS. 5A-5D may combined with the features of another of the depicted embodiments to form a different embodiment of the inventive concept. Likewise, one or more of the features described above with respect to one of the embodiments depicted above with respect to one of the embodiments depicted in FIGS. 5A-5D may be removed from that embodiment or otherwise modified. All such modifications are included within the scope of the inventive concept.

Semiconductor modules and electronic systems may include a solder joint structure of the inventive concept, a device stack structure of the inventive concept, a package stack structure of the inventive concept and/or a package mounting structure of the inventive concept.

Figure 6:
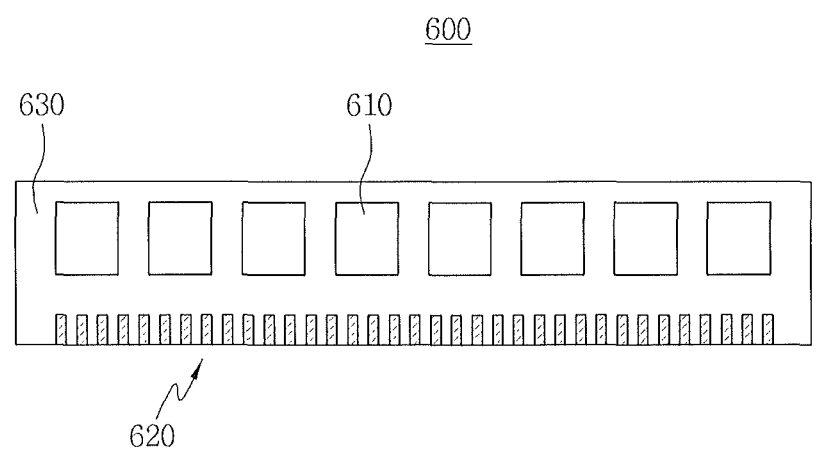
FIG. 6 is a block diagrams of a semiconductor module according to embodiments of the inventive concept.

As shown in FIG. 6, in some embodiments, a semiconductor module 600 may include a plurality of memory semiconductor devices 610 and a plurality of I/O terminals 620 disposed on a module substrate 630, wherein one or more of the plurality of memory semiconductor devices 610 may include a solder joint structure, device stack structure and/or package stack structure of the inventive concept.

Figure 7:
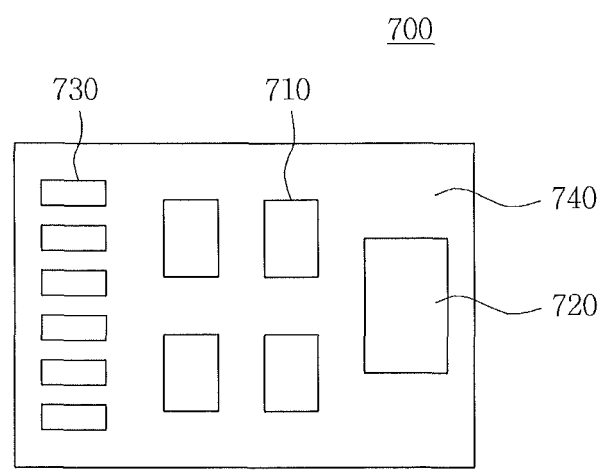
FIG. 7 is a block diagrams of a semiconductor module according to embodiments of the inventive concept.

As shown in FIG. 7, in some embodiments, a semiconductor module 700 may include a control unit 710, a storage unit 720 and I/O units 730 disposed on a module substrate 740, wherein the control unit 710 and/or the storage unit 720 may include a solder joint structure, device stack structure and/or package stack structure of the inventive concept.

Figure 8:
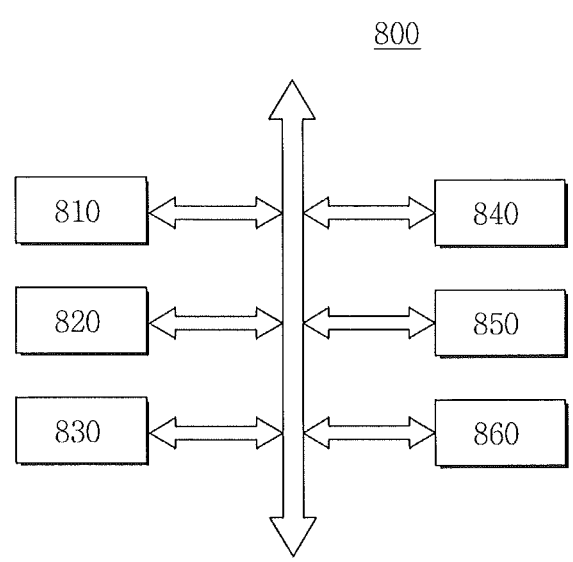
FIG. 8 is a block diagrams of an electronic system according to embodiments of the inventive concept.

As shown in FIG. 8, in some embodiments, an electronic system 800 may include an interface 810, a control unit 820, a storage unit 830, a display unit 840, and, optionally, an operation unit 850 and/or an optical I/O unit 860. The interface 810 may serve I/O functions. The control unit 830 may include a controller (e.g., a microprocessor). The storage unit 830 may include a memory device (e.g., an I/O memory device). The display unit 840 may include a display device. The operation unit 850 may include a signal transmitter and/or a sound card. The optical I/O unit 860 may include an optical sensor and/or an optical disc driver, The control unit 820 and/or the storage unit 830 may include a solder joint structure, device stack structure and/or package stack structure of the inventive concept.

As will be appreciated by one of skill in the art, many modifications may be made to the particular embodiments described above without materially departing from the inventive concept. For example, one or more of the features described above with respect to one of embodiments depicted in FIGS. 6-8 may combined with the features of another of the depicted embodiments to form a different embodiment of the inventive concept. Likewise, one or more of the features described above with respect to one of the embodiments depicted above with respect to one of the embodiments depicted in FIGS. 6-8 may be removed from that embodiment or otherwise modified. All such modifications are included within the scope of the inventive concept.

Methods of inhibiting the formation of one or more oxides on a surface of a metal bump may include forming a preservative film on the surface of the bump.

Methods of the inventive concept may be used to inhibit the formation of one or more oxides on the surface(s) of any suitable metal bump, including, but not limited to, bumps including nickel and/or copper (e.g., a nickel-copper bump). In some embodiments, the metal bump includes a first portion including a first metal and a second portion including a second metal, wherein the first and second metals are different. For example, methods of the inventive concept may be used to inhibit the formation of one or more oxides on the surface(s) of a nickel-copper bump, wherein the nickel-copper bump includes a first portion including nickel and a second portion including copper and wherein the first portion is substantially free of copper and the second portion is substantially free of nickel.

Any suitable preservative film may be formed on the surface(s) of the metal bump, including, but not limited to, a preservative film of the inventive concept.

A preservative film may be formed on any suitable surface of the metal bump. In some embodiments, the preservative film is formed on two or more surfaces of the metal bump. In some embodiments, the preservative film is formed on a surface of the metal bump that is to be coupled to another metal bump. For example, a preservative film may be formed on the top surface of a lower metal bump, wherein the top surface of the lower metal bump is to be coupled to the bottom surface of an upper metal bump (e.g., by soldering the top surface of the lower metal bump and the bottom surface of the upper metal bump together).

A preservative film may be formed on the surface(s) of the metal bump using any suitable method. In some embodiments, the preservative film is formed on the surface(s) of the metal bump by immersing the surface(s) of the metal bump in a solution including one or more constituents of the preservative film and/or by spraying the surface(s) of the metal bump with a solution including one or more constituents of the preservative film. The metal bump may be passively or actively dried following application of a solution including one or more constituents of the preservative film. For example, a preservative film may be formed on one or more surfaces of a copper bump by immersing the surface(s) of the bump in and/or spraying the surface(s) of the bump with a solution including benzotriazole and/or imidazole and then drying the copper bump, thereby forming a preservative film including a copper-benzotriazole compound and/or a copper-imidazole compound on the surface(s) of the bump.

One or more oxides may be removed from the surface of the metal bump prior to and/or concurrently with formation of the preservative film thereon. In some embodiments, the oxide(s) is/are removed by immersing the surface of the metal bump in a solution including one or more materials suitable for removing the oxide(s) from the surface of the metal bump and/or spraying the surface of the metal bump with a solution including one or more materials suitable for removing the oxide(s) from the surface of the metal bump. In some embodiments, one or more materials suitable for removing the oxide(s) from the surface of the metal bump are applied to the surface of the metal bump prior to and/or concurrently with application of the preservative film. For example, one or more oxides may be removed from the surface of the metal bump by applying a solution including one or more materials suitable for removing the oxide(s) from the surface of the metal bump and one or more constituents of the preservative film.

Figure 9:
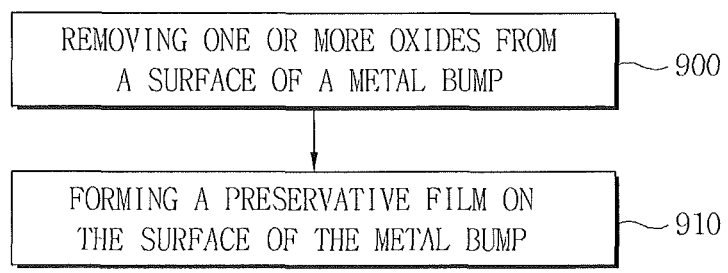
FIG. 9 is a flow chart describing a method of inhibiting the formation of one or more oxides on the surface of a metal bump.
Figure 10:
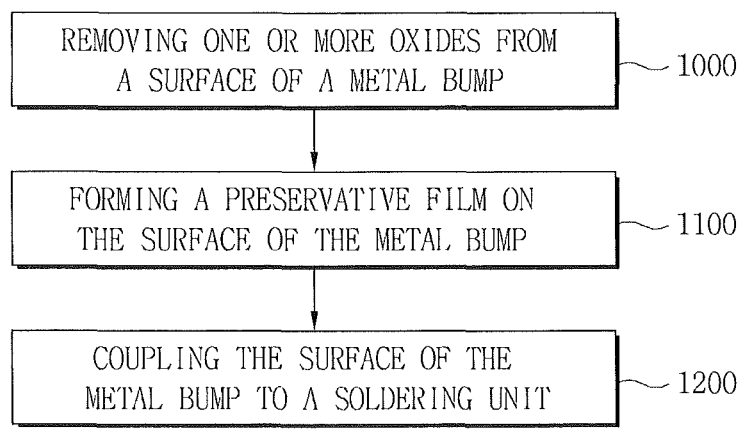

As shown in FIG. 9, in some embodiments, methods of the inventive concept include the steps of removing one or more oxides from a surface of a metal bump 900 and forming a preservative film on the surface of the metal bump 910. As noted above, the aforementioned steps may be carried out concurrently (e.g., by immersing the surface of the metal bump in and/or spraying the surface of the metal bump with a solution including materials suitable for removing oxides and one or more constituents of the preservative film) or sequentially (e.g., by immersing the surface of the metal bump in and/or spraying the surface of the metal bump with a first solution including materials suitable for removing oxides (e.g., an acidic solution including an oxide remover) and then adding one or more constituents of the preservative film to the first solution or immersing the surface of the metal bump in and/or spraying the surface of the metal bump with a second solution including one or more constituents of the preservative film).

Methods of forming a solder joint structure may include forming a preservative film on a surface of a metal bump and coupling the surface of the metal bump to a soldering unit.

Methods of the inventive concept may be used to form any suitable solder joint structure, including, but not limited to, a solder joint structure of the inventive concept.

Methods of the inventive concept may be used to couple a soldering unit to any suitable metal bump, including, but not limited to, bumps including nickel and/or copper (e.g., a nickel-copper bump). In some embodiments, the metal bump includes a portion of an interconnection, an input/output (I/O) pad, or a land. In some embodiments, the metal bump includes a first portion including a first metal and a second portion including a second metal, wherein the first and second metals are different and wherein the first portion may be substantially free of the second metal and/or the second portion may be substantially free of the first metal. For example, methods of the inventive concept may be used to couple a soldering unit to a nickel-copper bump including a first portion including nickel and a second portion including copper, wherein the first portion is substantially free of copper and the second portion is substantially free of nickel.

Methods of the inventive concept may be used to couple a soldering unit to any suitable surface of the metal bump. In some embodiments, the soldering unit is coupled to two or more surfaces of the metal bump. In some embodiments, the soldering unit is coupled to a surface of the metal bump that is to be coupled to another metal bump. For example, a soldering unit may be coupled to the top surface of a lower metal bump, wherein the top surface of the lower metal bump is to be coupled to the bottom surface of an upper metal bump (e.g., with the soldering unit interposed between the top surface of the lower metal bump and the bottom surface of the upper metal bump).

Any suitable preservative film may be formed on the surface of the metal bump, including, but not limited to, a preservative film of the inventive concept.

A preservative film may be formed on any suitable surface of the metal bump. In some embodiments, the preservative film is formed on the surface(s) of the metal bump that is/are coupled to the soldering unit as well as one or more additional surfaces of the metal bump. For example, a preservative film may be formed on the top and side surfaces of a lower metal bump, wherein only the top surface of the lower metal bump is to be coupled to the bottom surface of an upper metal bump (e.g., by soldering the top surface of the lower metal bump and the bottom surface of the upper metal bump together).

A preservative film may be formed on the surface(s) of the metal bump using any suitable method. In some embodiments, the preservative film is formed on the surface(s) of the metal bump by immersing the surface(s) of the metal bump in a solution including one or more constituents of the preservative film and/or by spraying the surface(s) of the metal bump with a solution including one or more constituents of the preservative film. The metal bump may be passively or actively dried following application of a solution including one or more constituents of the preservative film. For example, a preservative film may be formed on one or more surfaces of a copper bump by immersing the surface(s) of the bump in and/or spraying the surface(s) of the bump with a solution including benzotriazole and/or imidazole and then drying the copper bump, thereby forming a preservative film including a copper-benzotriazole compound and/or a copper-imidazole compound on the surface(s) of the bump.

One or more oxides may be removed from the surface of the metal bump prior to and/or concurrently with formation of the preservative film thereon. In some embodiments, the oxide(s) is/are removed by immersing the surface of the metal bump in a solution including one or more materials suitable for removing the oxide(s) from the surface of the metal bump and/or spraying the surface of the metal bump with a solution including one or more materials suitable for removing the oxide(s) from the surface of the metal bump. In some embodiments, one or more materials suitable for removing the oxide(s) from the surface of the metal bump are applied to the surface of the metal bump prior to and/or concurrently with application of the preservative film. For example, one or more oxides may be removed from the surface of the metal bump by applying a solution including one or more materials suitable for removing the oxide(s) from the surface of the metal bump and one or more constituents of the preservative film.

Any suitable soldering unit may be coupled to the metal bump, including, but not limited to, soldering units including tin and/or silver. In some embodiments, the soldering unit includes a solder ball. In some embodiments, the soldering unit is already coupled to one or more metal bumps. For example, a soldering unit may already be coupled to a second metal bump such that the aforementioned coupling step results in the coupling of the two metal bumps (e.g., with the soldering unit interposed between the two metal bumps).

A soldering unit may be coupled to the metal bump using any suitable method. In some embodiments, the soldering unit is coupled to the metal bump by contacting one or more surfaces of the metal bump with the soldering unit and heating the soldering unit. The soldering unit may be heated prior to, concurrently with and/or after contacting the surface(s) of the metal bump. For example, a soldering unit may be coupled to one or more surfaces of a copper bump by a thermal compression process wherein the soldering unit is heated to a temperature of at least about 240° C.

As one of skill in the art will appreciate, contacting the surface of a metal bump with a soldering unit may include contacting the preservative film on the surface of the metal bump with the soldering unit and heating the soldering unit such that at least a portion of the preservative film is removed from the surface of the metal bump, thereby exposing at least a portion of the surface of the metal bump and allowing the soldering unit to contact the surface of the metal bump.

A portion of the preservative film may be removed from one or more surfaces of the metal bump prior to, concurrently with and/or following the coupling step. In some embodiments, at least a portion of the preservative film is removed from the surface(s) of the metal bump that is/are coupled to the soldering unit. For example, some or all of the preservative film may be removed from the top surface of a lower metal bump concurrently with the coupling of the top surface to a soldering unit (e.g., by sublimation or by physical bursting).

As one of skill in the art will appreciate, the aforementioned methods may be used to form a solder joint structure including two or more metal bumps. For example, a solder joint structure including two metal bumps may be formed by coupling the surface(s) of a first metal bump and the surface(s) of a second metal bump to the soldering unit concurrently (e.g., by contacting the soldering unit to the surface(s) of the first metal bump and the surface(s) of the second metal bump concurrently and heating the soldering unit) or sequentially (e.g., by coupling the surface(s) of the first metal bump to the soldering unit and then coupling the surface(s) of the second metal bump to the soldering unit).

Figure 10:
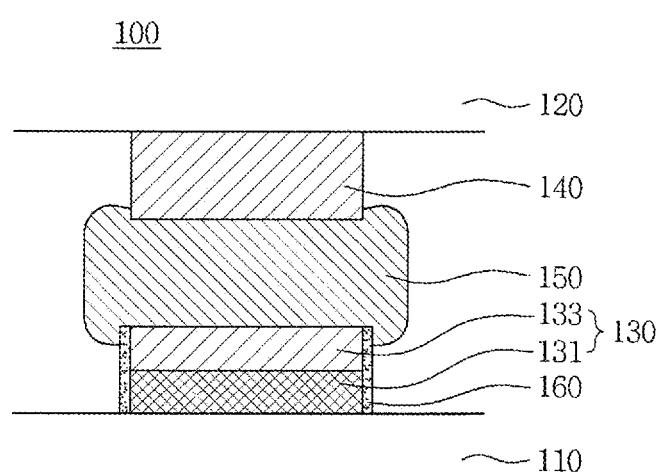
FIG. 10 is a flow chart describing a method of forming a solder joint structure.

As shown in FIG. 10, in some embodiments, methods of the inventive concept include removing one or more oxides from a surface of a metal bump 1000, forming a preservative film on the surface of the metal bump 1100 and coupling the surface of the metal bump to a soldering unit 1200. As noted above, the aforementioned removing 1000 and forming 1100 steps may be carried out concurrently (e.g., by immersing the surface of the metal bump in and/or spraying the surface of the metal bump with a solution including materials suitable for removing oxides and one or more constituents of the preservative film) or sequentially (e.g., by immersing the surface of the metal bump in and/or spraying the surface of the metal bump with a first solution including materials suitable for removing oxides and then adding one or more constituents of the preservative film to the first solution or immersing the surface of the metal bump in and/or spraying the surface of the metal bump with a second solution including one or more constituents of the preservative film). Also as noted above, some or all of the preservative film may be removed from the surface of the metal bump concurrently with the aforementioned coupling step 8c (e.g., a portion of the preservative film may be removed from the surface of the metal bump when the soldering unit is brought into contact with the film-covered surface of the metal bump and heated).

As shown in FIGS. 11A-11E, in some embodiments, methods of the inventive concept include forming a seed layer 1110 on a lower substrate 1101, forming mask pattern 1120 on the seed layer 1110, forming a lower metal bump 1130 on the seed layer 1110, removing the mask pattern 1120, forming a preservative film 1160 on one or more surfaces of the lower metal bump 1130 and coupling the lower metal bump 1130 to a soldering unit 1150, wherein the soldering unit 1150 is coupled to an upper metal bump 1140.

Figure 11A:
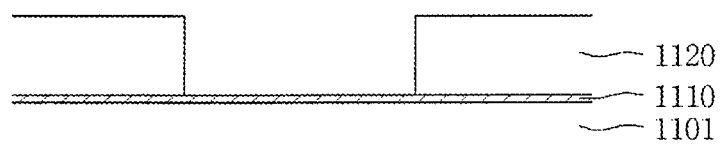
FIGS. 11A-11E are diagrams illustrating a method of forming a joint structure according to other embodiments of the inventive concept.

As shown in FIG. 11A, in some embodiments, a seed layer 1110 is formed on a lower substrate 1101. The lower substrate 1101 may include any suitable substrate, including, but not limited to, a wafer, a semiconductor chip, a package substrate, a module board and a motherboard. The seed layer 1110 may be formed using any suitable method, including, but not limited to, a physical deposition process (e.g., a sputtering process) and a chemical deposition process (e.g., a chemical vapor deposition (CVD) process). The seed layer 1110 may include any suitable material, including, but not limited to, titanium and copper. In some embodiments, the seed layer 1110 includes tin and copper. For example, the seed layer 1110 may include a multi-layered structure including a tin layer and a copper layer. For brevity, FIG. 11A illustrates the seed layer 1110 as a single layer.

Also as shown in FIG. 11A, in some embodiments, a mask pattern 1120 is formed on the seed layer 1110. The mask pattern 1120 may be formed using any suitable method. The mask pattern 1120 may include any suitable material. In some embodiments, the mask pattern 1120 includes a photoresist.

Figure 11B:
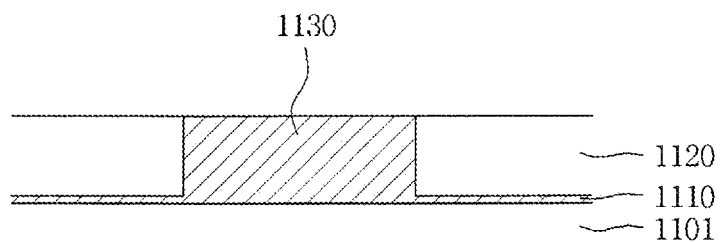

As shown in FIG. 11B, in some embodiments, a lower metal bump 1130 is formed on the seed layer 1110. The lower metal bump 1130 may be formed using any suitable method, including, but not limited to, an electroplating process, an electroless plating process and a deposition process. The lower metal bump 1130 may include any suitable material, including, but not limited to, nickel and/or copper. In some embodiments, the lower metal bump 1130 includes a first portion including a first metal and a second portion including a second metal, wherein the first and second metals are different. For example, the lower metal bump 1130 may include a nickel-copper bump, wherein the nickel-copper bump includes a first portion including nickel and a second portion including copper and wherein the first portion may be substantially free of copper and the second portion may be substantially free of nickel. In some embodiments, the lower metal bump 1130 and the seed layer 1110 include one or more of the same material (e.g., copper) and the interface therebetween disappears, as shown.

Figure 11C:
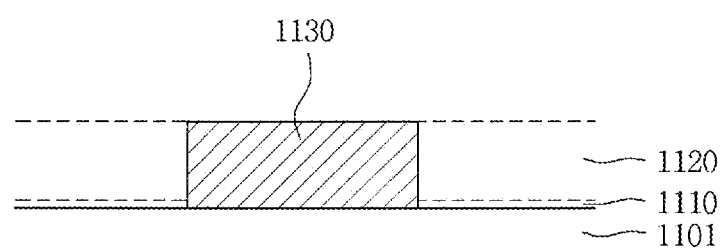

As shown in FIG. 11C, in some embodiments, the mask pattern 1120 and, optionally, the seed layer 1110 disposed under the mask pattern 1120 are removed from the lower substrate 1101. When seed layer 1110 and/or mask pattern 1120 is/are removed, the lower metal bump 1130 may substantially maintain its original shape. One or more oxides (e.g., an oxide layer) may be removed from the surface(s) of the lower metal bump 1130 prior to, concurrently with or following removal of the mask pattern 1120 and/or the seed layer 1110 underlying the mask pattern 1120.

Figure 11D:
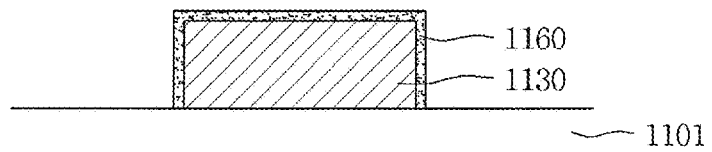

As shown in FIG. 11D, in some embodiments, a preservative film 1160 is formed on one or more surfaces of the lower metal bump 1130. Any suitable preservative film may be formed, including, but not limited to, a preservative film of the inventive concept. The preservative film 1160 may be formed using any suitable method, including, but not limited to, the methods described above and may be formed on any suitable surface(s) of the lower metal bump 1130.

Figure 11E:
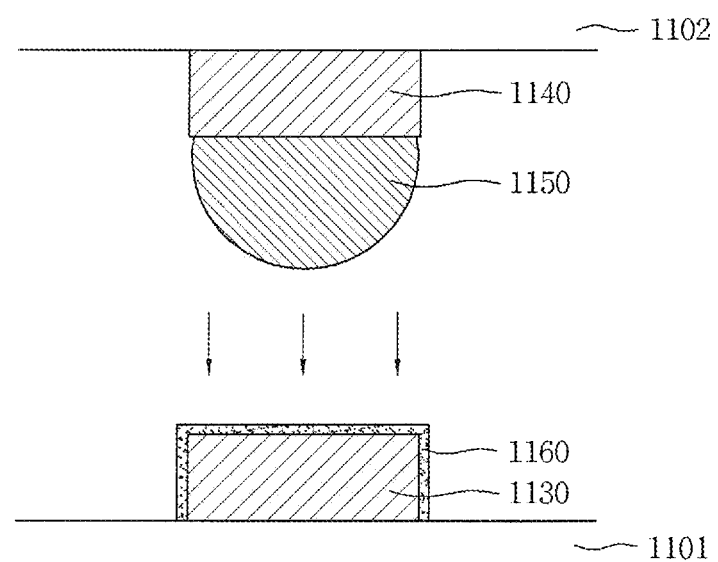

As shown in FIG. 11E, in some embodiments, the lower metal bump 1130 is coupled to soldering unit 1150, wherein the soldering unit 1150 is coupled to an upper metal bump 1140 formed on a bottom surface of an upper substrate 1102, thereby forming a solder joint structure (e.g., a solder joint structure as shown in any one of FIGS. 1A-2P). The lower metal bump 1130 may be coupled to the soldering unit 1150 (and thereby the upper metal bump 1140) using any suitable method, including, but not limited to, a thermal compression process as described above. For example, the lower metal bump 630 may be coupled to the upper metal bump 1140 and the soldering unit 1150 using a thermal compression process wherein the soldering unit 1150 is heated to a temperature of about 240° C. A portion of the preservative film 1160 may be removed from the lower metal bump 1130 during the coupling step. Accordingly, the soldering unit 1160 and the lower metal bump 1130 may be brought into direct contact with each other.

Figure 12A:
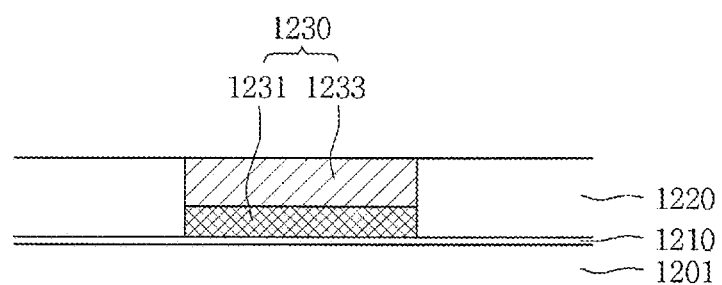
FIGS. 12A-12C are diagrams illustrating a method of forming a joint structure according to other embodiments of the inventive concept.
Figure 12B:
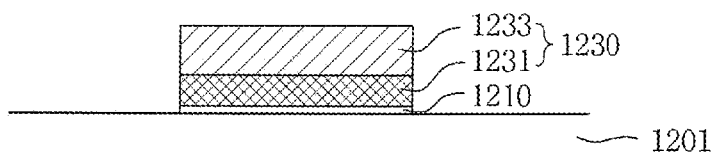
Figure 12C:
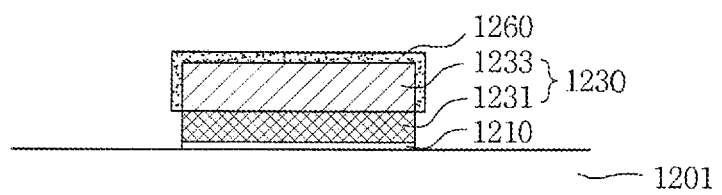

As shown in FIGS. 12A-12C, in some embodiments, the lower metal bump 1230 may include a first portion 1231 including a first metal and a second portion 1233 including a second metal, wherein the first and second metals are different. For example, the lower metal bump 1230 may include a nickel-copper bump, wherein the nickel-copper bump includes a first portion 1231 including nickel and a second portion 1233 including copper and wherein the first portion 1231 may be substantially free of copper and the second portion 1233 may be substantially free of nickel.

As shown in FIG. 12A, in some embodiments, a mask pattern 1220 is used to form a lower metal bump 1230 on a seed layer 1210 overlying a lower substrate 1201 as described above with respect to FIGS. 11A-11B. As stated above, the lower substrate 1201, seed layer 1210 and mask pattern 1220 may include any suitable materials and may be formed using any suitable methods. The lower metal bump 730 may likewise be formed using any suitable method.

As shown in FIG. 12B, in some embodiments, the mask pattern 1220 and, optionally, the seed layer 1210 disposed under the mask pattern 1220 are removed from the lower substrate 1201 as described above with respect to FIG. 11C. As stated above, the lower metal bump 1230 may substantially maintain its original shape when the seed layer 1210 and/or the mask pattern 1220 is/are removed, and one or more oxides (e.g., an oxide layer) may be removed from the surface(s) of the lower metal bump 1230 prior to, concurrently with or following removal of the mask pattern 1220 and/or the seed layer 1210 underlying the mask pattern 1220.

As shown in FIG. 12C, in some embodiments, a preservative film 1260 is formed on one or more surfaces of the lower metal bump 1230 as described above with respect to FIG. 11D. As stated above, the preservative film 1260 may include any suitable preservative film and may be formed using any suitable method. In some embodiments, the preservative film 1260 is formed only on one or more surfaces of the second portion 1233 of the lower metal bump 1230 (i.e., is not formed on a surface of the first portion 1231 of the lower metal bump 1230).

As one of skill in the art will appreciate, a lower metal bump 1230 prepared in accordance with the description of FIGS. 12A-12C may be further processed as discussed above with respect to FIG. 11E (e.g., the lower metal bump 1230 may be coupled to a soldering unit via a thermal compression process wherein the soldering unit is heated to a temperature of about 240° C. to form a solder joint structure as shown in any one of FIGS. 1A-2P).

Figure 13A:
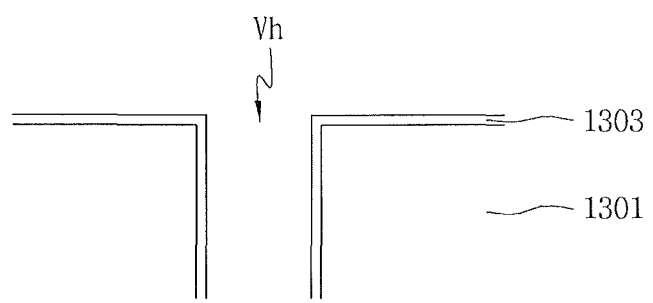
FIGS. 13A-13C are diagrams illustrating a method of forming a joint structure according to other embodiments of the inventive concept.
Figure 13B:
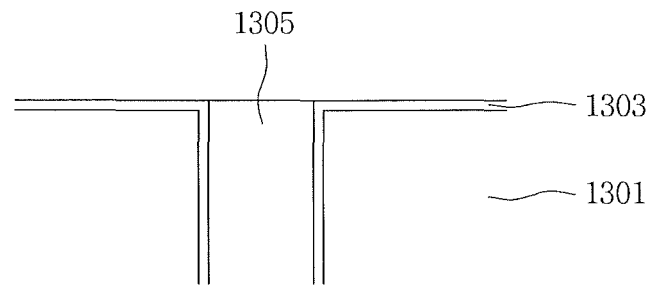
Figure 13C:
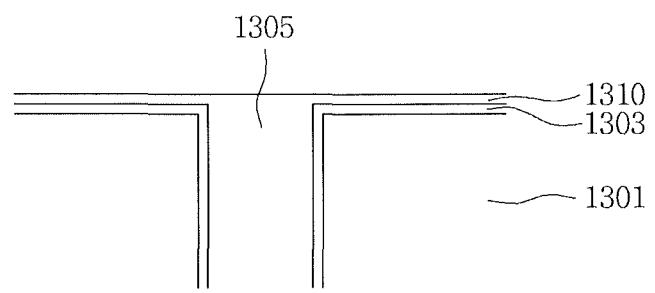

As shown in FIGS. 13A-13C, in some embodiments, the lower substrate 1301 may include a via plug 1305 and the lower metal bump may be formed such that at least a portion of the lower metal bump overlies the via plug 1305. The via plug 1305 may include any suitable material, including, but not limited to, copper. In some embodiments, the via plug 1305 includes a through silicon via (TSV).

As shown in FIG. 13A, in some embodiments, the lower substrate 1301 includes a via hole Vh, and a liner 1303 is formed on one or more surfaces of the via lower substrate 1301 (e.g., on the top surface of the lower substrate 1301 and/or on the surface(s) of the lower substrate 1301 that form the boundaries of the via hole Vh). The liner 1303 may include any suitable material, including, but not limited to, an insulating material (e.g., silicon oxide or silicon nitride).

As shown in FIG. 13B, in some embodiments, a via plug 1305 is formed in the via hole Vh. As noted above, the via plug 1305 may include any suitable material and may be formed using any suitable method.

As shown in FIG. 13C, in some embodiments, a seed layer 1310 is formed on the surface of the via plug 1305 and, optionally, on the surface of the lower substrate 1301 and/or the surface of any portion of the liner 1303 that overlies the surface of the lower substrate 1301.

As one of skill in the art will appreciate, lower substrate 1301 prepared in accordance with the description of FIGS. 13A-13C may be further processed as discussed above with respects to FIGS. 11A-11E and/or FIGS. 12A-12C (e.g., a lower metal bump may be form on the seed layer and coupled to a soldering unit via a thermal compression process wherein the soldering unit is heated to a temperature of about 240° C. to form a solder joint structure as shown in any one of FIGS. 1A-2P).

The foregoing is illustrative of embodiments of the inventive concept and is not to be construed as limiting thereof. Although a few embodiments have been described, those skilled in the art will readily appreciate that many modifications are possible in embodiments without materially departing from the novel teachings and advantages of the inventive concept. Accordingly, all such modifications are intended to be included within the scope of this inventive concept as defined in the claims.

In the claims, means-plus-function clauses are intended to cover the structures described herein as performing the recited function, and not only structural equivalents but also equivalent structures. Therefore, it is to be understood that the foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A solder joint structure, comprising:
   a lower via plug in a lower substrate;
   a lower seed layer on the lower via plug, the lower seed layer comprising copper;
   a lower metal bump directly on the lower seed layer, the lower metal bump comprising an upper portion and a lower portion;
   a soldering unit;
   an organic preservative film comprising an organic metal compound; and
   an upper metal bump on the soldering unit,
   wherein the upper portion of the lower metal bump and the upper metal bump comprise copper,
   wherein sidewalls of the upper portion of the lower metal bump are vertically aligned with sidewalls of the lower portion of the lower metal bump,
   wherein the soldering unit is directly coupled to at least a portion of a top surface of the upper portion of the lower metal bump,
   wherein the organic preservative film is disposed on at least one lateral surface of the upper portion of the lower metal bump, and
   wherein the organic preservative film is not disposed on the lower portion of the lower metal bump and surfaces of the upper metal bump.

2. The solder joint structure of claim 1, wherein the organic preservative film is disposed on at least a portion of the top surface of the upper portion of the lower metal bump.

3. The solder joint structure of claim 1, wherein the soldering unit covers a portion of the lateral surface of the upper portion of the lower metal bump.

4. The solder joint structure of claim 1, wherein the soldering unit covers a portion of a surface of the organic preservative film.

5. The solder joint structure of claim 1, wherein a lateral surface of the soldering unit protrudes beyond a lateral surface of the lower metal bump.

6. The solder joint structure of claim 1, wherein the lower portion of the lower metal bump comprises nickel and is substantially free of copper.

7. The solder joint structure of claim 1, wherein the organic metal compound comprises at least one organic copper compound selected from a group consisting of copper-benzotriazole ($CuC_6H_5N_3$) and copper-imidazole ($CuC_3H_4N_2$).

8. The solder joint structure of claim 1, wherein the organic preservative film comprises a copper-benzotriazole compound having a structure represented by Chemical Formula 2:

Chemical Formula 2

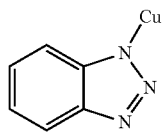

and a copper-imidazole compound having a structure represented by Chemical Formula 4:

Chemical Formula 4

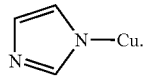

9. The solder joint structure of claim 1, further comprising:
an upper via plug in an upper substrate, wherein the upper via plug is disposed on the upper metal bump.

10. The solder joint structure of claim 9, further comprising:
an upper seed layer between the upper metal bump and the upper via plug, the upper seed layer comprising copper.

11. A solder joint structure comprising:
a lower via plug in a lower substrate;
a lower seed layer on the lower via plug, the lower seed layer comprising copper;
a lower copper bump directly on the lower seed layer, wherein an upper portion of the lower copper bump comprises copper and a lower portion of the lower copper bump is substantially free of copper and wherein sidewalls of the upper portion of the lower copper bump are vertically aligned with sidewalls of the lower portion of the lower copper bump;
an upper copper bump beneath an upper substrate;
an upper via plug in an upper substrate, wherein the upper via plug is disposed on the upper copper bump;
a soldering unit directly coupled to a top surface of the upper portion of the lower copper bump and to a bottom surface of the upper copper bump; and
a copper compound covering a lateral surface of the upper portion of the lower copper bump, wherein the copper compound is not disposed on the lower portion of the lower copper bump and lateral surfaces of the upper copper bump.

12. The solder joint structure of claim 11, wherein the copper compound comprises an imino group, or an amino group.

13. The solder joint structure of claim 12, wherein the copper compound comprises Cu—NH, or Cu—$NH_2$.

14. The solder joint structure of claim 11, further comprising:
a lower conductive via plug connected to the lower copper bump disposed in the lower substrate; and
an upper conductive via plug connected to the upper copper bump disposed in the upper substrate.

15. The solder joint structure of claim 11, further comprising:
an upper seed layer between the upper copper bump and the upper via plug, the upper seed layer comprising copper.

16. A solder joint structure comprising:
a lower via plug in a lower substrate;
a lower seed layer on the lower via plug, the lower seed layer comprising copper;
a lower copper bump directly on the lower seed layer, wherein an upper portion of the lower copper bump comprises copper and a lower portion of the lower copper bump comprises nickel and is substantially free of copper and wherein sidewalls of the upper portion of the lower copper bump are vertically aligned with sidewalls of the lower portion of the lower copper bump;
an upper copper bump on a upper conductive element;
an upper via plug in an upper substrate, wherein the upper via plug is disposed on the upper metal bump;
an upper seed layer between the upper metal bump and the upper via plug, the upper seed layer comprising copper;
a soldering unit between the lower copper bump and the upper copper bump, wherein the soldering unit directly contacts at least a portion of a top surface of the upper portion of the lower copper bump; and
an organic copper compound covering at least a portion of a lateral surface of the upper portion of the lower copper bump, wherein the organic copper compound is not disposed on the lower portion of the lower copper bump and lateral surfaces of the upper copper bump.

* * * * *